(12) United States Patent
Kirsch

(10) Patent No.: US 8,299,798 B2
(45) Date of Patent: Oct. 30, 2012

(54) RELAY TEST SYSTEM AND METHOD

(75) Inventor: Marcos Kirsch, Austin, TX (US)

(73) Assignee: National Instruments Corporation, Austin, TX (US)

( * ) Notice: Subject to any disclaimer, the term of this patent is extended or adjusted under 35 U.S.C. 154(b) by 305 days.

(21) Appl. No.: 12/826,299

(22) Filed: Jun. 29, 2010

(65) Prior Publication Data

US 2011/0316544 A1 Dec. 29, 2011

(51) Int. Cl.
*G01R 31/327* (2006.01)
*G01R 31/08* (2006.01)

(52) U.S. Cl. ........................................ 324/418; 370/251

(58) Field of Classification Search .................. 324/418, 324/424, 415, 417, 419; 361/139, 160, 166, 361/206, 211, 819, 1, 78, 157; 370/241, 370/244, 247, 248, 250, 251, 389, 400, 401
See application file for complete search history.

(56) References Cited

U.S. PATENT DOCUMENTS

| | | | |
|---|---|---|---|
| 3,922,537 A | | 11/1975 | Jackson |
| 4,300,207 A | | 11/1981 | Eivers et al. |
| 6,104,592 A | * | 8/2000 | Pohl ............................... 361/139 |
| 6,396,279 B1 | * | 5/2002 | Gruenert ...................... 324/424 |
| 6,621,270 B2 | * | 9/2003 | Johnson et al. ............... 324/418 |
| 6,842,723 B2 | * | 1/2005 | Alicherry et al. ................. 703/2 |
| 7,005,856 B2 | * | 2/2006 | Deak et al. .................... 324/418 |
| 7,053,624 B2 | * | 5/2006 | Klijn et al. ..................... 324/415 |
| 7,706,283 B2 | * | 4/2010 | Mehta et al. ................... 370/238 |
| 2005/0030693 A1 | * | 2/2005 | Deak et al. .................... 361/160 |
| 2006/0076958 A1 | * | 4/2006 | Deak et al. .................... 324/418 |
| 2008/0075007 A1 | * | 3/2008 | Mehta et al. .................. 370/238 |
| 2011/0242616 A1 | * | 10/2011 | Oto ............................... 358/448 |

OTHER PUBLICATIONS

"Graph Theory," Wikipedia, the free encyclopedia, http://en.wikipedia.org/wiki/Graph_theory, 10 pages. (Retrieved May 18, 2010).
"Dijkstra's Algorithm," Wikipedia, the free encyclopedia, http://en.wikipedia.org/wiki/Dijkstra's_algorithm, 6 pages. (Retrieved May 18, 2010).
"Minimum Spanning Tree," Wikipedia, the free encyclopedia, http://en.wikipedia.org/wiki/Minimum_spanning_tree, 6 pages. (Retrieved May 18, 2010).

* cited by examiner

*Primary Examiner* — Hoai-An D Nguyen
(74) *Attorney, Agent, or Firm* — Meyertons Hood Kivlin Kowert & Goetzel, P.C.

(57) ABSTRACT

A method of testing a relay set which includes mapping a relay set to an undirected graph indicative of a topology of the relay set and includes vertices indicative of channels of the relay set and edges extending between corresponding vertices indicative of relays. Values based on a characteristic of a relay of the relay set that corresponds to the respective edge of the undirected graph are stored. A plurality of candidate test paths for a relay-to-test that each connects a first input/output (I/O) channel and a second I/O channel, and includes the relay-to-test are identified. A total value for the edges of the candidate test paths is determined for each of the candidate test paths. The total values are compared to one another and a test path is determined for the relay-to-test based on the comparison.

20 Claims, 9 Drawing Sheets

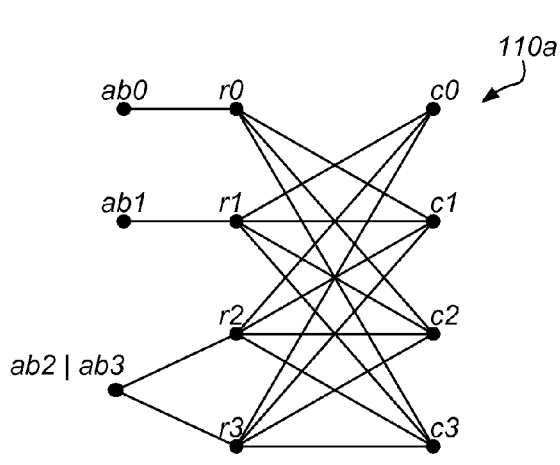
FIG. 2A
FIG. 3A
| Relay | Condition |
|---|---|
| 102a | Stuck-Open |
| 102b | Untested |
| . | . |
| . | . |
| 102n | Untested |
| 102o | Untested |
| 102p | Untested |
| 104a | Untested |
| . | . |
| . | . |
| 104d | Untested |
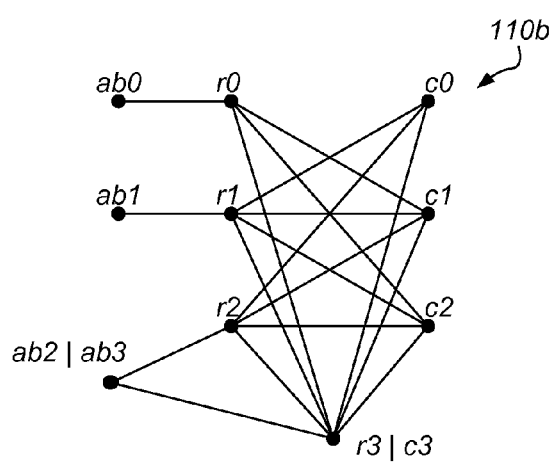
FIG. 2B
FIG. 3B
| Relay | Condition |
|---|---|
| 102a | Stuck-Open |
| 102b | Pass |
| . | . |
| . | . |
| 102n | Unknown |
| 102o | Untested |
| 102p | Stuck-Closed |
| 104a | Untested |
| . | . |
| . | . |
| 104d | Untested |
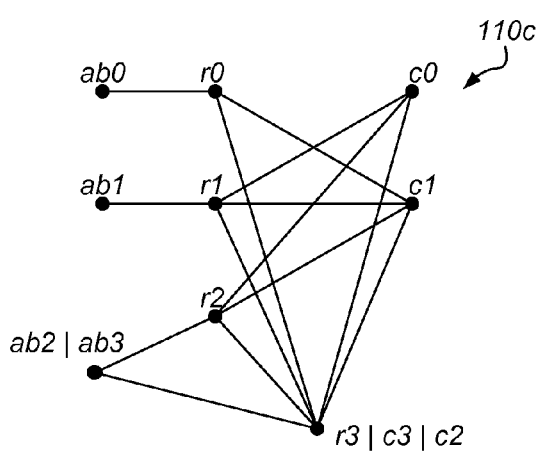
FIG. 2C
FIG. 3C
| Relay | Condition |
|---|---|
| 102a | Stuck-Open |
| 102b | Pass |
| . | . |
| . | . |
| 102n | Pass |
| 102o | Stuck-Closed |
| 102p | Stuck-Closed |
| 104a | Untested |
| . | . |
| . | . |
| 104d | Untested |

RELAY TEST SYSTEM AND METHOD

BACKGROUND OF THE INVENTION

1. Field of the Invention

This invention relates to assessing conditions of relays, and more particularly to systems and methods for testing a relay set, such as a switch matrix.

2. Description of the Related Art

A relay is an electrical switch that opens and closes an electrically conductive path under the control of another electrical circuit. Electromagnetic relays are generally susceptible to mechanical or electrical failures that can cause the relay to operate unreliably. For example, a relay maybe stuck in an opened or closed position, often referred to as a relay that is stuck-open or stuck-closed. Products which integrate the use of relays, such as electronic switch modules, are generally susceptible to similar problems. In cases where the relay contacts are exposed to outside signals, as is normally the case in a switch module used with automated test equipment, this problem can be further exacerbated because there is no integrated circuitry to protect the relays without impacting product performance. Accordingly, these types of products are susceptible to failure due to either extended normal operation or abusive operation.

While a relay failure is often an expected circumstance of using these types of products, this occurrence is nonetheless inconvenient. If a relay failure is undetected, the failure can cause errors in operation and function of a corresponding device, such as a switch. In the event of automated test equipment, relay failures can cause mis-routing of signals and invalid test results. Furthermore, due to the often high density of relays in these types of switch modules, isolating a failure once it occurs can be an even larger inconvenience. For example, a user may spend a great deal of time testing operation of individual relays in an attempt to locate a failure, and even after locating the failure a switch module may need to be reconfigured to work around the failure. In some instances, a routine may be executed in software to operate one or more relays to locate a failure. Such routines, however, may not be able to identify or resolve the failure, may be time consuming, and may be physically taxing on the switch and the relays themselves as hundreds of repetitive iterations of cycling relays may be performed in an attempt to isolate a failure to one or more relays.

Accordingly, it is desirable to provide a relay module test system and method to provide for efficient and accurate testing and diagnosis of electronic devices that incorporate relays, such as electronic switch modules.

SUMMARY

Described herein are embodiments relating to a system and method of integrated testing of relay/switch modules. For example, in some embodiments, provided is a method of testing a relay set. The method includes mapping a relay set to an undirected graph indicative of a topology of the relay set. The undirected graph includes vertices indicative of channels of the relay set and edges indicative of relays of the relay set, where edges extend between corresponding vertices. The method also includes storing values corresponding to the edges of the undirected graph, where the assigned value for each edge is based on a characteristic of a relay of the relay set that corresponds to the respective edge. The method further includes identifying a plurality of candidate test paths for a relay-to-test. Each of the plurality of candidate test paths connects a first input/output (I/O) channel and a second I/O channel, and includes the relay-to-test. The method also includes determining a total value for each of the candidate test paths, including totaling the values for the edges of the given one of the candidate test paths. The method further includes comparing the total values for each of the candidate test paths to one another and determining a test path for the relay-to-test based on the comparison of the total values for each of the candidate test paths to one another.

In some embodiments, provided is a non-transitory computer readable storage medium comprising program instructions stored thereon, wherein the program instructions are executable to cause a computer system to perform a method of testing a relay set. The method includes mapping a relay set to an undirected graph indicative of a topology of the relay set. The undirected graph includes vertices indicative of channels of the relay set and edges indicative of relays of the relay set, where edges extend between corresponding vertices. The method also includes assigning values to edges of the undirected graph, where the assigned value for each edge is based on a characteristic of a relay of the relay set that corresponds to the respective edge. The method further includes identifying a plurality of candidate test paths for a relay-to-test. Each of the plurality of candidate test paths connects a first input/output (I/O) channel and a second I/O channel, and includes the relay-to-test. The method also includes determining a total value for each of the candidate test paths, including totaling the values for the edges of the given one of the candidate test paths. The method further includes comparing the total values for each of the candidate test paths to one another and determining a test path for the relay-to-test based on the comparison of the total values for each of the candidate test paths to one another.

In some embodiments, provided is a system that includes a computer system that maps a relay set to an undirected graph indicative of a topology of the relay set. The undirected graph includes vertices indicative of channels of the relay set and edges indicative of relays of the relay set, where edges extend between corresponding vertices. The computer system also assigns values to edges of the undirected graph, where the assigned value for each edge is based on a characteristic of a relay of the relay set that corresponds to the respective edge. The computer system also identifies a plurality of candidate test paths for a relay-to-test. Each of the plurality of candidate test paths connects a first input/output (I/O) channel and a second I/O channel, and includes the relay-to-test. The computer system also determines a total value for each of the candidate test paths, including totaling the values for the edges of the given one of the candidate test paths. The computer system also compares the total values for each of the candidate test paths to one another and determining a test path for the relay-to-test based on the comparison of the total values for each of the candidate test paths to one another.

BRIEF DESCRIPTION OF THE DRAWINGS

A better understanding of the present invention can be obtained when the following detailed description of the preferred embodiment is considered in conjunction with the following drawings, in which:

FIGS. 2A-2C are diagrams that illustrate exemplary graphical models of the exemplary switch relay matrix of FIG. 1A having modifications that reflect relay conditions in accordance with one or more embodiments of the present technique;

FIGS. 3A-3C illustrate exemplary relay tables in accordance with one or more embodiments of the present technique;

Figure 1A:
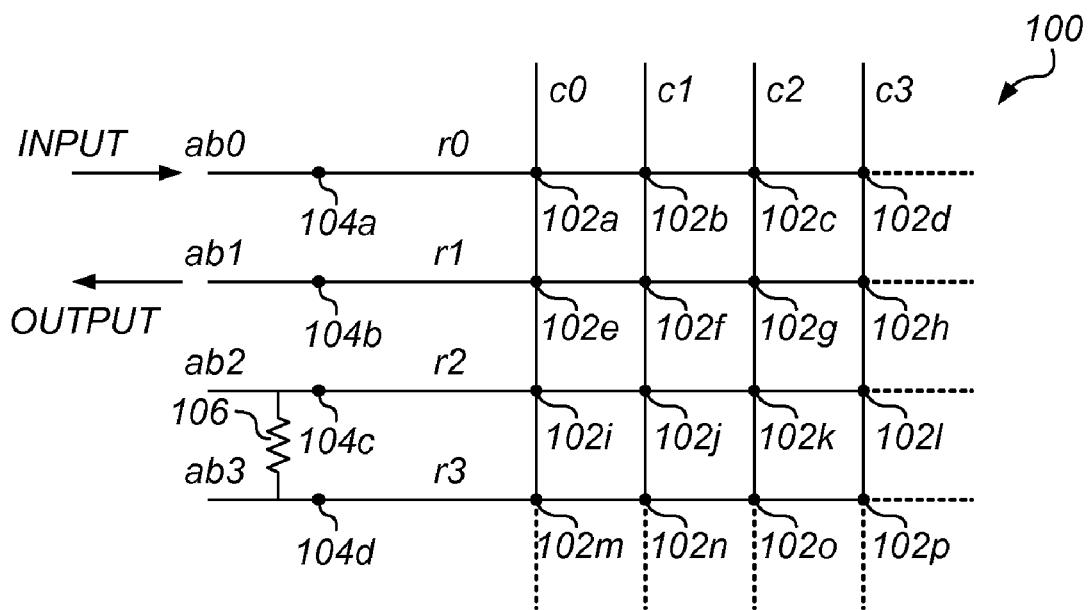
FIG. 1A is a diagram that illustrates an exemplary switch relay matrix in accordance with one or more embodiments of the present technique.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of embodiments of the present invention. However, one having ordinary skill in the art should recognize that the invention may be practiced without these specific details. In some instances, well-known circuits, structures, and techniques have not been shown in detail to avoid obscuring the present invention.

As discussed in more detail below, certain embodiments include systems and methods relating to testing of a relay set in a matrix (e.g., a switch matrix), multiplexer, or other topology. In some embodiments, an undirected-weighted graph is employed to model a switch/relay matrix. In certain embodiments, a model including an undirected-weighted graph is employed by an algorithm to determine the condition of relays within the switch/relay matrix (e.g., operational, stuck-open, stuck-closed, or unknown). In some embodiments, an undirected-weighted graph is modified to reflect the condition of relays within the switch/relay matrix. In certain embodiments, stuck-open relays may be represented by eliminating paths (edges) between their respective vertices within an undirected-weighted graph. In some embodiments, stuck-closed relays may be represented by merging their respective vertices and corresponding edges within an undirected-weighted graph. In certain embodiments, an undirected-weighted graph is used to assess how to implement testing of particular relays. In certain embodiments, paths for testing one or more relays are determined based on a value associated with the path (e.g., a "cost" of using the path). In some embodiments, multiple paths are assessed for a relay-to-test, and a particular path is selected over other potential paths (e.g., candidate paths) based on a comparison of cost associated with each of the paths. In certain embodiments, testing relays includes testing relays in one or both of a path-mode or an S-T Cut mode. In some embodiments, testing relays includes acquiring information about one or more relays and storing that information (e.g., in knowledge units) for resolving relay conditions based on later acquired information. In certain embodiments, a test sequence includes a series of iterations that progress through some or all of the relays of a switch/relay matrix in an attempt to resolve a condition for some or all of the relays.

FIG. 1A is a diagram that illustrates an exemplary switch/relay matrix ("matrix") 100 in accordance with one or more embodiments of the present technique. Matrix 100 may be representative of the topology of a switch used to provide a connection between a plurality of inputs and outputs. In some embodiments, matrix 100 includes a plurality of rows and columns that may be connected to one another to enable inputs and outputs to be electrically coupled (e.g., connected) to one another to provide a conductive path there through. For example, in the illustrated embodiment, matrix 100 includes a 4×4 matrix including four rows (r0-r3) and four columns (c0-c3). Any of the rows (r0-r3) may be connected to any of the columns (c0-c3) via relays (e.g., switches) 102a-p located at an intersection of each row (r0-r3) and column (c0-c3). The rows and columns may be referred to as channels of matrix 100. Although matrix 100 may be illustrated as a 4×4 matrix in an attempt to simplify the discussion provided herein, it will be appreciated that matrix 100 may include any number of rows and columns to generate a matrix of any size. When a given relay 102a-p is closed, the respective row is connected to the respective column. For example, in the illustrated embodiment, closing the labeled relay 102a may connect row r0 to column c0.

In some embodiments, input/output (I/O) paths may provide for the routing of signals into and out of matrix 100. For example, in the illustrated embodiment, input/output (I/O) paths ab0-ab3 is connected to rows r0-r3 respectively. I/O paths ab0-ab3 may enable an input signal to be provided into matrix 100 on one row and a corresponding output signal to exit matrix 100 at another row. In some embodiment, one or more I/O relays are used to connect or disconnect an I/O path to a portion of matrix 100. For example, in the illustrated embodiment, I/O relays 104a-d are provided between I/O paths ab0-ab3 and corresponding rows r0-r3. During operation, I/O relays may be individually operated to control connection of I/O paths ab0-ab3 to rows r0-r3 of matrix 100. In some embodiments, ab0 includes a source vertex coupled to a first channel of a path detection circuit, and output at ab1 includes a destination vertex coupled to a second channel of the path detection circuit. In some embodiments, during testing two or more I/O paths (e.g., other than a source and destination coupled to the path detection circuit) are connected via one or more resistors. For example, in the illustrated embodiment, I/O paths ab2 and ab3 may be connected via a resistor 106 while a signal is provided on I/O paths ab0 and ab1.

To connect a given input/output (I/O) path to another I/O path, two or more relays may be closed to provide a contiguous path between the respective I/O paths. For example, in the illustrated embodiment, to connect an input at path ab0 to an output at ab1, I/O relays 104a and 104b may be closed, as well as relays 102a and 102e. In some embodiments, alternate paths may be taken to connect two or more I/O lines. Such an alternate path may be implemented to bypass relays that are not functioning properly or to provide for testing of a particular relay, as discussed below. For example, where relay 102a is stuck-open (such that it can not connect column c0 to row r0), to connect an input at path ab0 to an output at ab1, I/O relays 104a and 104b may be closed, as well as relays 102b and 102f.

Figure 1B:
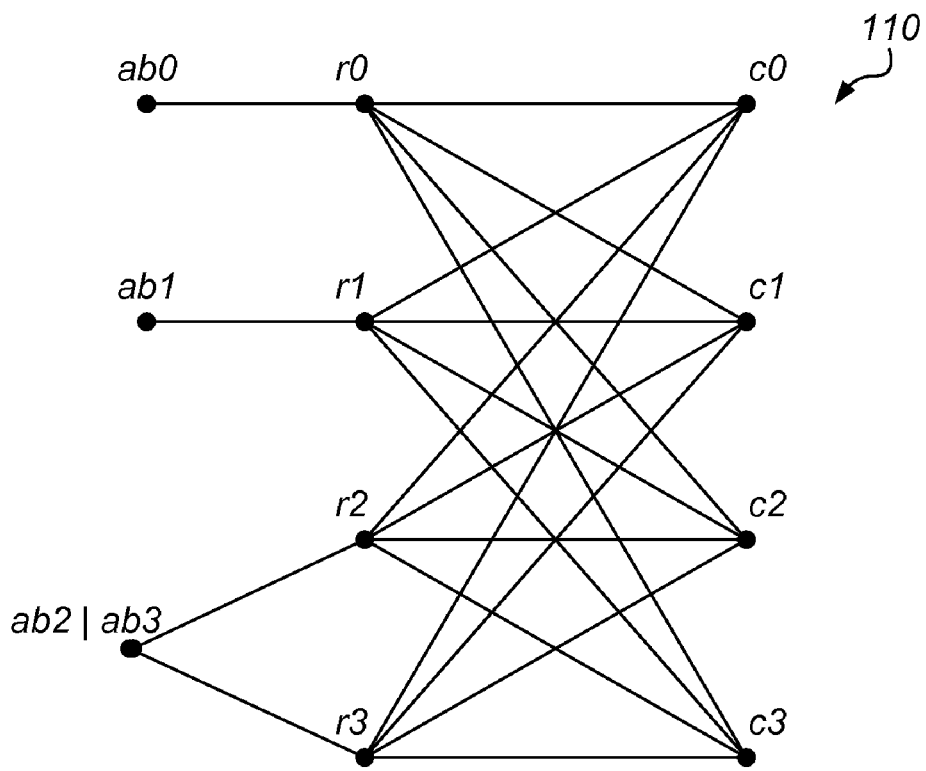
FIG. 1B is a diagram that illustrates an exemplary graphical model of the exemplary switch relay matrix of FIG. 1A in accordance with one or more embodiments of the present technique.

FIG. 1B is a diagram that illustrates an exemplary graphical model ("graph") 110 of matrix 100 of FIG. 1A in accordance with one or more embodiments of the present technique. In the illustrated embodiment, each of the paths of matrix 100 is represented by a vertex (or node), and each relay is represented by an edge (or line) connecting respective vertices. For example, vertices r0-r3 may represent rows r0-r3, vertices c0-c3 may represent columns c0-c3, and vertices ab0-ab3 may represent I/O paths ab0-ab3, respectively. The edges that extend between each of the respective vertices r0-r3, c0-c3, and ab0-ab3 may represent one or more of relays 102a-102p and I/O relays 104a-104d. For example, in the illustrated embodiment, the edge extending between vertex r0 and vertex c0 may be representative of relay 102a. As discussed above when a relay is closed, it may provide a connection between the two respective vertices. For example, closing relay 102a may connect paths r0 and c0 and opening relay 102a may provide an electrical disconnect between paths r0 and c0. Similar conditions may be represented by each of the vertices and edges of graph 100.

In some embodiments, graph 110 may include an undirected graph. In some embodiments, the undirected graph may include no distinction between the two vertices associated with each edge. In some embodiments, the undirected graph may include no weighting assigned to the edges of the graph. A path within a graph may include a sequence of vertices having an edge that connects each vertex to the next vertex in the sequence. For example, a path may extend from ab0 to r0 to c1 to r1 to ab1. A path through a graph may be infinite, but a finite path always has end or terminal vertices that include a first vertex (e.g., a start vertex) and a last vertex (e.g., an end vertex). In the above example, vertices ab0 and ab1 may be end vertices. Vertices in the path, other than end vertices, are internal vertices. In the above example, vertices r0, c1 and r1 may be internal vertices. A path with no repeated vertices is referred to as a simple path. The above example, including ab0 to r0 to c1 to r1 to ab1 may be a simple path.

In some embodiments, a relay condition may be determined ("solved") as functioning properly and, thus, may be identified as a having "pass" condition. For example, where testing determines that a relay is able to both open and close in response to an appropriate command, the relay may be labeled as "pass". In some embodiment, a relay condition may be solved as being stuck in the opened position (e.g., the relay is unable to connect the two corresponding paths/vertices) and, thus, may be identified as being in a "stuck-open" condition. For example, where testing determines that a relay is provided in an opened state and does not switch to the closed state in response to an appropriate command to close, the relay may be labeled as "stuck-open". In some embodiment, a relay condition may be solved as being stuck in the closed position (e.g., the relay connects the two corresponding paths/vertices, and does not disconnect the two corresponding paths/vertices) and, thus, may be identified as having a "stuck-closed" condition. For example, where testing determines that a relay is provided in a closed state and does not switch to the opened state in response to an appropriate command, the relay may be labeled as "stuck-closed". In some embodiments, a relay condition may not be solved, and may be labeled as "unknown". For example, a relay condition may be unknown where multiple relays have failed in close proximity to one another and it is impossible to determine the individual states of the respective relays.

Graph 110 may be used to find the condition of ("solve") some or all of the relays of an associated switch/matrix 100. In some embodiments, graph 110 may be modified to reflect conditions of relays as they are determined. For example, where a relay is solved as "stuck-open", the corresponding edge maybe removed from graph 110. Where a relay is solved as "stuck-closed", the corresponding vertices may be merged into a single vertex, and any edges that are now parallel (connect to the same two vertices) as a result of merging the vertices are merged into a single edge. For example, where an edge "kXY" connects vertices "X" and "Y", upon determining that a relay corresponding to "kXY" is stuck-closed, edge "kXY" may be removed from the graph, vertex "X|Y" is created, all edges connecting to vertices "X" and "Y" are redirected/connected to vertex "X|Y", vertices "X" and "Y" are removed from the graph, and where there are multiple edges connecting the same vertices, the edges are "merged" into a single edge between the two vertices. Removal of the edge may be representative of the inability of the stuck-open relay to provide a connection between the two respective vertices. Combining the vertices may be indicative of the inability of the stuck-closed relay to provide a disconnect between the two vertices of the relay.

In some embodiments, having relays that are stuck-closed may result in other relays being parallel, which if operated simultaneously effectively act as one relay, hereafter referred to a merged relays. For example, where a row has two stuck-closed relays connected thereto, the two respective columns also connected to the two relays are effectively connected to one another. Thus, operating a relay coupling one of the columns to another row may also couple the other column to the other row also. Thus, the relays connected to each of the columns may be merged such that closing a relay between a one column and row couples both columns to the rows, making it difficult to determine whether one or both of the relays that connect the columns to the rows are stuck-closed. As discussed in more detail below, additional processing may be conducted to identify the conditions of each of the relays of a set of merged relays.

FIGS. 2A-2C are diagrams that illustrate graphs 110a-110c having modifications that reflect relay conditions in accordance with one or more embodiments of the present technique. In some embodiments, FIGS. 2A-2C may be indicative of the dynamic updates/modifications to graph 110 during execution of a testing routine that progressively determines conditions of relays of matrix 100. For example, graphs 110 may represent an initial set of conditions and graphs 110a-110c may be indicative of changes to graph 110 as relay 102a is determined as stuck-open, relay 102p is subsequently determined as stuck-closed, and relay 102o is subsequently determined as stuck-closed.

In FIG. 2A, graph 110a has been modified from that of 110 to reflect relay 102a being determined as stuck-open such that it cannot provide a connection between row r0 and column c0 (see FIG. 1A). Accordingly, the corresponding edge between corresponding vertices r0 and c0 has been removed from graph 110a. In FIG. 2B, graph 110b has been modified from that of 110a to further reflect relay 102p being determined as stuck-closed such that it cannot provide a disconnect between row r3 and column c3 (see FIG. 1A). Accordingly, the corresponding vertices r3 and c3 of graph 110b have been merged into a single vertex r3|c3. In FIG. 2C, graph 110c has been modified from that of 110b to further reflect relay 102o being determined as stuck-closed such that it cannot provide a disconnect between row r3 and column c3 (see FIG. 1A). Accordingly, the corresponding vertices c2 and r3|c3 of graph 110b have been merged into a single vertex r3|c3|c2. The edges that have become parallel due to the creation of vertex r3|c3|c2 will be treated as merged relays. Relays 102c and 102d, 102g and 102h, and 102k and 102l may be merged relays. That is connecting one of the relays to the respective row also connects both columns c2 and c3 to the respective row.

A condition of each of the relays may be stored in a relay table. In some embodiments, a relay table may include an identifier for some or all of the relays of the matrix and some of all of the corresponding conditions of the relays. For example, FIGS. 3A-3C illustrate relay tables 120a-120c in accordance with one or more embodiments of the present technique. FIG. 3A illustrates a relay table 120a that reflects the conditions of relays of matrix 100 that are depicted in FIG. 2A. For example, relay 102a has a condition of "Stuck-open", while the other relays condition remains "Untested". The large number of untested relays may be indicative of early iterations of a testing routine that has not yet tested many relays. FIG. 3B illustrates a relay table 120b that reflects the conditions of relays of matrix 100 depicted in FIG. 2B. For example, relay 102a has a condition of "Stuck-open" and relay 102p has a condition of "Stuck-closed", while some relays have a condition of "Pass", "Untested", or "Unknown". The status of unknown may indicate that the relay has been tested but the condition could not be determined. In some embodiments, the terms unresolved and unsolved may refer to relays that are untested or unknown (e.g., that a condition of passed, stuck-open or stuck-closed has not be determined for). The increase in the number of passing relays and lower number of untested relays may be indicative of later iterations of a testing routine that has tested many relays. FIG. 3C illustrates a relay table 120c that reflects the conditions of relays depicted in FIG. 2C. For example, relay 102a has a condition of "Stuck-open", relay 102p has a status of "Stuck-closed", and relay 102o has a condition "Stuck-closed", while some relays have a condition of "Pass" and other relays condition remains "Untested". The lower number of untested relays may be indicative of later/final iterations of a testing routine that has tested substantially all relays of matrix 100. Note, relay 102n has a condition change from "Unknown" to "Pass", which may be indicative of subsequent testing allowing the status of relay 102n to be resolved (e.g., using knowledge units as described in more detail below with regard to FIG. 5).

The condition of a relay may be determined by identifying a relay-to-test, identifying one or more test paths within the matrix to use in accessing the relay-to-test, applying the determined path, and operating one or more of the relays within the path to determine a state of the relay-to-test (e.g., now the relay-under-test) and/or other relays within the path. Such a technique may be referred to as path-mode testing. In some embodiments, test paths used to implement path-mode testing may include simple paths that extend from a start vertex (e.g., input ab0) to an end vertex (e.g., output ab1), as discussed above.

In some embodiments, a relay-to-test may be selected at random from one of the untested and/or unknown relays. In some embodiments, a relay-to-test may be selected by progressing down the relay table (e.g., relay tables 120a-120c) and selecting the next unsolved relay (e.g., the next relay having a condition of untested and/or unknown). In some embodiments, a graph (e.g., graphs 110-110c) may be used to identify one or more test paths for the testing of one or more relays (e.g., including the relay-to-test). For example, candidate test paths may only follow edges within a graph. In some embodiments, a test path is broken into two segments, or sub-paths: a sub-path from a source (e.g., input at ab0) to an input vertex of the relay-to-test, and a sub-path from a second vertex of the relay-to-test to a destination (e.g., output at ab1). In some embodiments, multiple potential (e.g., candidate) sub-paths are identified and concatenated to identify candidate test paths, a cost (e.g., a total distance) of each the test paths is calculated, the path with the lowest cost is determined and returned for use in testing. In some embodiments, Dijkstra's algorithm may be used to identify/calculate the sub-paths.

FIGS. 4A-4D are diagrams that illustrate graphs 110d-110h that reflect conditions of relay 102a-102p in accordance with one or more embodiments of the present technique. In some embodiments, graphs 110d-110e reflect conditions similar to that of graph 110 of FIG. 1B. Thus, graphs 110d-110e may reflect a graph before the conditions of one or more of the relays have been identified as stuck-open or stuck-closed. For example, all relays 102a-102p may be identified as untested or passed, and thus all edges may be available for use within test paths and test sub-paths. In the illustrated embodiment, relay 102k may be identified as the relay-under-test, as indicated by the bold edge between vertices r2 and c2. In preparation for testing relay 102k, one or more test paths to and from vertices r2 and c2 of relay 102k may be determined. For example, in FIG. 4B, a test sub-path 130a from ab0 to r0 to c0 to r2 may be identified as an input test sub-path, and a test sub-path 132a from c2 to r1 to ab1 may be identified as an output test sub-path. Test sub-paths 130a and 132a and the relay-to-test may be collectively referred to as test path 134a. It is noted that test sub-paths 130a and 132a are provided only on the available edges of the graph. For example, if graph 110b of FIG. 2B were used to determine test paths for testing relay 102k at vertices r2 and c2 a test path from ab0 to r0 to c1 to r2 may be identified as an input test path, due to relay 102a being stuck-open and, therefore unable to connect vertices r0 and c0 as indicated by the removal of the edge between the vertices r0 and c0.

During testing, sub-path 130a may be implemented by closing relays 104a, 102a, and 102i, and sub-path 132a may be implemented by closing relays 104b and 102g. Thus, if all relays in sub-paths 130a and 132a are operational (e.g., in the pass condition) or failed as stuck-closed, the condition of relay 102k (e.g., the relay-under-test) may be assessed by opening and closing relay 102k. If, for example, a contiguous path is detected at the input ab0 and the output ab1 when relay 102k is commanded closed and a disconnect in the path is detected at the input ab0 and the output ab1 when relay 102k is commanded opened, then relay 102k may be determined to be operational (e.g., in the pass condition). Where a contiguous path is detected at input ab0 and the output ab1 when relay 102k is commanded closed or opened, relay 102k may be determined to have a stuck-closed condition (e.g., failure) if all of the unknown relays that are not in the path would not create a path between ab0 and ab1 when assumed stuck-closed, and the corresponding relay table may be updated accordingly. Note, other relays in the paths 130a and 132a may also be stuck-closed, and further testing may be required to make such a determination, as discussed in more detail below with regard to FIGS. 7A-8B. Where a disconnect is detected at input ab0 and the output ab1 when relay 102k is commanded closed or opened, relay 102*k* may be determined to have a stuck-closed failure if all of the other relays in the path have been determined as operational (e.g., in the pass condition) or having a stuck-closed condition, and the corresponding relay table may be updated accordingly. Note, where the condition of one or more other relays in the path are unsolved (e.g., untested or unknown), other relays in the path may also have stuck-open failures, and further testing may be needed to make such a determination whether or not relay 102*k* is stuck-open and/or one or more other relays in the test paths 130*a* and 132*a* have stuck-open failures, as discussed in more detail below with regard to FIGS. 7A-8B.

In some embodiments, test paths may be determined based on a value for one or more of the candidate test paths. For example, various portions (e.g., edges) of graph may be assigned a value, the combined value for a given candidate path (e.g., the combined value of the edges of a given path) may be calculated, the total value compared to total values for other candidate test paths, and one of the candidate paths may be selected over the others based on the comparison of the combined value for the candidate paths. In some embodiments, the value may be referred to as a "cost" or "weight". It will be appreciated that although the exemplary embodiments refer to a cost and selecting a path having the lowest/minimal cost, comparing combined values of candidate paths may be implemented using similar techniques for comparing value associated with paths (e.g., maximizing a cost) that are intended to fall within the scope of the technique described herein.

In some embodiments, each edge of the current graph may be assigned a cost value. For example, in graph 110 of FIG. 1B, each of the edges between vertices r1-r3, c0-c3, ab0, ab1, and ab2|ab3 may be assigned a cost value. In some embodiments, a cost value is assigned to an edge based on one or more characteristics (e.g., a condition) presently associated with the corresponding relay. The characteristics may be intrinsic to a given relay or may be dynamically updated/modified during execution of a testing routine. For example, edges corresponding to untested relays may be assigned a low cost, edges corresponding to unknown relays may be assigned a high cost, and edges corresponding to pass relays may be assigned an intermediate cost. Thus, selecting candidate paths with an overall lower cost than other candidate path may help to steer path finding toward test paths having untested relays and to avoid test paths including unknown relays that can be problematic is assessing and determining the condition of relays in the respective test path. In some embodiments, other factors may contribute to the cost of an edge to further steer the test paths to use or not use particular relays. For example, the number of times a relay has already been used in test paths and/or the number of times a relay has been cycled (e.g., opened or closed) may be used as a factor to determine a cost for a particular edge/relay. In some embodiment, for instance, a high number of uses for an edge/relay may increase the corresponding cost, wherein a low number of uses for an edge/relay may reduce the corresponding cost. Such an embodiment may help to spread out relay usage during testing, thereby helping to even-out the physical wear across the relays. In some embodiments, a higher cost may be associated with solved relays/edges than untested and/or unsolved relays/edges to promote the use of untested/unsolved relays within test paths. In some embodiments, a relay/edge that appears in a greater number of knowledge units (discussed in greater detail below with regard to FIG. 5) may be assigned a lower cost than a relay/edge that appears in a fewer number of knowledge units, such that the relay/edge that appears in a greater number of knowledge units may be targeted for being solved more quickly by being more likely to be included in test paths. In some embodiments, a higher cost may be associated with relays/edges that need to be flipped between states (e.g. between opened and closed) than relays/edges that do not need to be flipped between states to provide the test path. Thus, relay cycles may be reduced to reduce wear on the relays. In some embodiments, flipping of a relay state may only be a factor for a solved relay/edge as unsolved relays/edges may need to be flipped during testing as discussed in more detail below. In some embodiments a combination of characteristics may be considered. For example, a cost may be based on a combination of a current condition of the relay and the number of times a relay has been cycled (e.g., closed).

Figure 4A:
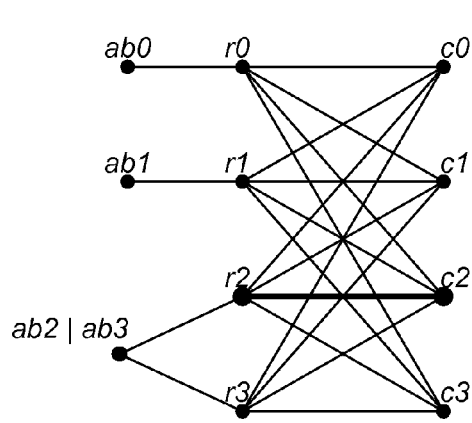
FIGS. 4A-4D are diagrams that illustrate exemplary paths within the graphical models of the exemplary switch relay matrix in accordance with one or more embodiments of the present technique.
Figure 4B:
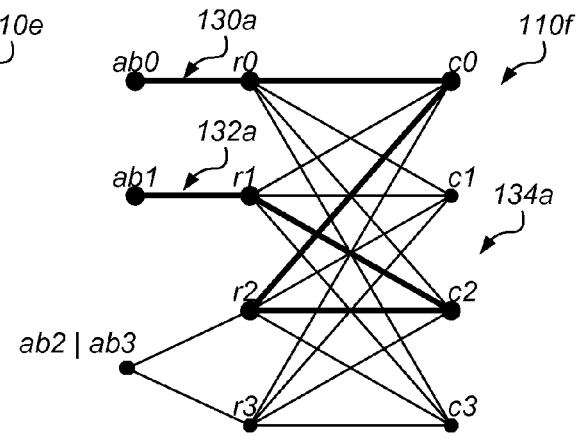
Figure 4C:
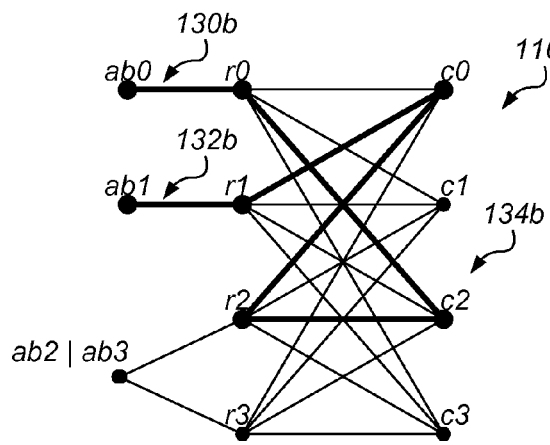
Figure 4D:
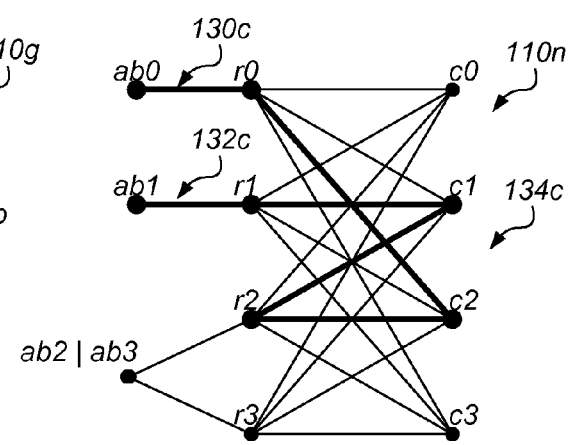

Candidate test paths may be identified by assessing multiple sub-paths that may connect an input to an output while passing through the relay-to-test. In some embodiments, multiple sub-paths may be compared that extend from an input to a first/input vertex of an edge corresponding to the relay-to-test (e.g., the edge to test), and/or multiple paths may be compared that extend from an output to a second/output vertex of an edge corresponding to the relay-to-test. In some embodiments, candidate test sub-paths from an input and output that terminate at opposite vertices of the relay/edge under test, respectively, may be considered. In some embodiments, in order to avoid sub-paths extending through the same vertex of a graph, vertices already used in a first sub-path (e.g., an input/output sub-path) are removed such that they can not be used in generating the corresponding second sub-path (e.g., an output/input sub-path). Thus, the resulting test path may remain a simple path. As described above, in some embodiments, Dijkstra's algorithm may be used to identify/calculate the sub-paths. FIGS. 4B-4D may illustrate a plurality of candidate test paths having costs that can be compared to one another to determine a test path for use in testing the relay-to-test (e.g., relay 102*k*). For example, in FIG. 4B a first candidate test path 134*a* may include test sub-path 130*a* from ab0 (e.g., source) to r0 to c0 to r2 (e.g., a first input test sub-path), and a test sub-path 132*a* from c2 to r1 to ab1 (e.g., destination) (e.g., a first output test sub-path), in FIG. 4C a second candidate test path 134*b* may include test sub-path 130*b* from ab0 to r0 to c2 (e.g., a second input test path), and a test sub-path 132*b* from r2 to c0 to r1 to ab1 (e.g., a second output test path), and in FIG. 4D a third candidate test path 134*c* may include test sub-path 130*c* from ab0 to r0 to c2 (e.g., a third input test path), and a test sub-path 132*c* from r2 to c1 to r1 to ab1 (e.g., a third output test path). A cost for each of the edges may be calculated for each of the edges in candidate test paths 134*a*, 134*b* and 134*c*, a total costs may be calculated for each of candidate test paths 134*a*, 134*b* and 134*c* (e.g., by totaling the edge costs for each of the test paths 134*a*, 134*b* and 134*c*), the total cost for each of candidate test paths 134*a*, 134*b* and 134*c* may be compared to determine which of candidate test paths 134*a*, 134*b* and 134*c* has the lowest total cost, and the candidate test path determined to have the lowest cost may be implemented as the test path for testing the condition of the relay/edge to test, as discussed in more detail below.

The condition of a relay may be determined by identifying a relay-to-test, identifying partitions of the graph that exists at each vertex of the relay-to-test, identifying a set of relays/edges that when opened breaks the graph into two disjointed sub-graphs where one of the sub-graphs includes a source vertex (e.g., input at ab0) and the other of the sub-graph includes a destination vertex (e.g., output at ab1), opening the identified set of relays, and cycling the relay-under-test to determine a condition of the relay-under-test. Such a technique may be referred to as S-T Cut mode testing.

In some embodiments, during testing, all relays of a switch (e.g., 102a-102p of matrix 100) are closed, except for those relays included in an S-T Cut set (e.g., a set of relays/edges that when opened breaks the graph into two disjointed sub-graphs where one of the sub-graphs includes a source vertex (e.g., input at ab0) and the other of the sub-graph includes a destination vertex (e.g., output at ab1)). For example, implementing an S-T Cut mode test may include: finding the path that goes through the relay-to-test, where the source and destination vertices include two channels connected to a path detection circuit (e.g., input at ab0 and output ab1), dividing the full graph into two sets separated by vertices of an S-T Cut set (e.g., where all vertices not in the S-T Cut set are to be closed during testing), closing all of the relays except those in the S-T Cut set, and cycling the relay-to-test to determine the condition of the relay-to-test. It is noted that closing a large number of relays (e.g. non-latching relays) may require great amount of power as each relay may require a given amount of power to close.

In some embodiments, a reduced set of relays to close during an S-T Cut test operation is determined, and only those relays of the reduced set may be closed during the S-T Cut test to reduce power consumption and wear on relays that do not necessarily need to be closed. In some embodiments, the set of relays to be closed during the S-T Cut test may be determined based on a minimum spanning forest for disjoined graphs, using Kruskal's algorithm. Given a connected, undirected graph, a spanning tree of that graph is a sub graph which is a tree and connects all the vertices together. A single graph can have many different spanning trees. Any undirected graph (not necessarily connected) has a minimum spanning forest, which is a union of minimum spanning trees for its connected components. In some embodiments, implementing an S-T Cut mode test may include: finding the path that goes through the relay-to-test, where the source and destination vertices include two channels connected to a path detection circuit (e.g., input at ab0 and output ab1), dividing the full graph into two sets (e.g., sub graphs) separated by vertices of an S-T Cut set (e.g., where all vertices not in the S-T Cut set are to be closed during testing), removing all of the edges in the graph corresponding to the S-T Cut set, calculating a minimum spanning forest for the disjointed sub graphs, identifying relays that correspond to the minimum spanning forest, closing all of the relays identified as corresponding to the minimum spanning forest (e.g., opening the other relays not contained in the minimum spanning forest), and cycling the relay-to-test to determine the condition of the relay-to-test.

The state of a relay may be determined by implementing the S-T Cut mode test. For example, where relay 102k is the relay-under-test, and a contiguous path is detected at the input ab0 and the output ab1 when relay 102k is commanded closed and a disconnect in the path is detected at the input ab0 and the output ab1 when relay 102k is commanded opened, then relay 102k may be determined to be operational (e.g., in the pass condition). Where a contiguous path is detected at input ab0 and the output ab1 when relay 102k is commanded closed or opened, it may be determined that at least one of relay 102k and the relays in the S-T Cut has a stuck-closed failure, and the corresponding relay table may be updated accordingly. Note that further testing may be required to make a determination which relay(s) are stuck-closed, as discussed in more detail below. Where a disconnect is detected at input ab0 and the output ab1 when relay 102k is commanded closed or opened, relay 102k may be determined to have a stuck-opened failure, and the corresponding relay table may be updated accordingly.

Knowledge about one relay, even unsolved, may be helpful in solving the condition of one or more other relays. In some embodiments, as the relay test routine executes, information is gathered regarding the conditions of relays, and sometimes it is not immediately possible to deduce the condition of a relay with complete certainty, but enough information may be obtained to generate a "knowledge unit" that provides at least some information regarding the condition of one or more untested or unsolved relays. A knowledge unit may include a set of unsolved relays and a relay condition that corresponds to the set of unsolved relays. Information contained in the knowledge unit may be updated as relays are solved to assess and determine conditions of remaining unsolved relays.

Figure 5:
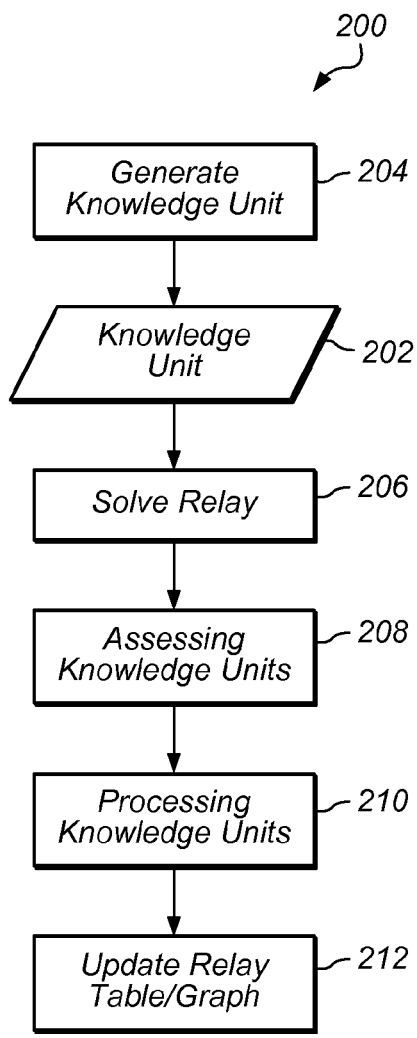
FIG. 5 is a flowchart that illustrates a method of implementing knowledge units in accordance with one or more embodiments of the present technique.

FIG. 5 is a flowchart that illustrates a method 200 of implementing knowledge units in accordance with one or more embodiments of the present technique. Method 200 may include generating a knowledge unit 202, as depicted at block 204. In some embodiments, knowledge units 202 may be generated during one or more test routines as discussed above. For example, where a test routine results in multiple unsolved relays associated with a failure condition, but which of the relays exhibit the condition can not be determined, the unsolved relays may be combined in a relay set contained in knowledge unit associated with a particular failure condition. In some embodiments, the knowledge unit may be stored in a memory for subsequent access. A plurality of knowledge units 204 may be generated during testing routines.

Method 200 may also include solving a relay, as depicted at block 206. In some embodiments, solving a relay may include determining its condition as passed, stuck-open or stuck-closed. Method 200 may also include assessing knowledge units, as depicted at block 206. For example, when a relay is solved, (e.g., a relay is determined to be passed, stuck-open, or stuck-closed), all the knowledge units may be assessed recursively to see if knowledge units contain the now solved relay in their set of unsolved relays, and if one or more of the relays of the set of unsolved relays can be solved based on the condition of the now solved relay. For example, in some embodiments, when relay X is solved, each knowledge unit is assessed to determine if they include an unsolved relay set that includes relay X.

Method 200 may also include processing knowledge units, as depicted at block 210. For example, if a knowledge unit does include an unsolved relay set that includes relay X, and relay X's condition matches the condition corresponding to the set of unsolved relays, the knowledge unit is deleted. For example, if a knowledge unit includes unsolved relays X, Y and Z having a condition of stuck-closed and X is determined to be stuck-closed, then the knowledge unit is deleted. If a knowledge unit does include an unsolved relay set that includes relay X, and relay X's condition does not match the condition corresponding to the set of unsolved relays, the reference to the relay is deleted form the knowledge unit. For example, if a knowledge unit includes unsolved relays X, Y and Z having a condition of stuck-closed and X is determined to be stuck-opened, then the X is deleted from the knowledge unit such that a modified knowledge unit having an unsolved relay set including Y and Z, and a corresponding condition of stuck-closed remains. Repeated knowledge units may be deleted such that only one of the repeated knowledge units remains. Knowledge units having an unsolved relay set including only one relay, the relay may be solved as having the condition corresponding to the knowledge unit.

Method 200 may also include updating a relay table and/or a graph, as depicted at block 212. For example, a relay table (e.g., table 120a-120c) may be updated to reflect the conditions for solved relays. In some embodiments, relays included in an unsolved relay set of one or more knowledge units may be listed as unsolved or untested. In some embodiments, a corresponding graph (e.g., 110) may be updated to reflect the conditions of the solved relays (e.g., stuck-open, or stuck-closed). Passed relays may not require the graph to be updated.

Figure 6:
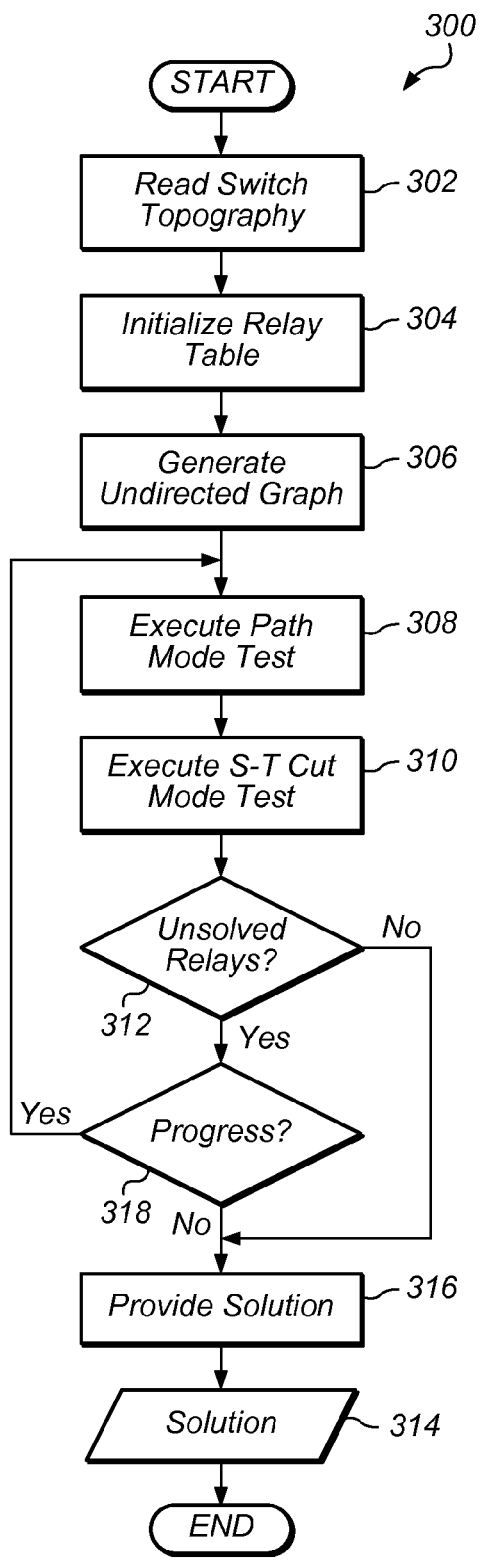
FIG. 6 is a flowchart that illustrates a method of testing a relay/switch matrix in accordance with one or more embodiments of the present technique.

FIG. 6 is a flowchart that illustrates a method 300 of testing a relay/switch matrix in accordance with one or more embodiments of the present technique. Method 300 may include reading switch topography, as depicted at block 302. In some embodiments, reading switch topography may include identifying a topography of a corresponding relay/switch matrix to be tested. For example, reading a switch topography 302 may include identifying the topography of 4×4 matrix 100 and corresponding I/O paths of matrix 100 of FIG. 1A. In some embodiments, the topography may be retrieved from a memory, and/or may be generated and stored in a memory for subsequent use.

Method 300 may include initializing a relay table, as depicted at block 304. In some embodiments, initializing a relay table may include retrieving or generating a table for recording the conditions of relays. For example, initializing a relay table 304 may include generating a table similar to that of tables 120a-120c. In some embodiments, the tables may be retrieved from a memory, and/or may be generated and stored in a memory for subsequent use.

Method 300 may include executing path-mode testing, as depicted at block 308. Path-mode testing may include determining the condition of a relay by identifying a relay-to-test, identifying one or more test paths within the matrix to use in accessing the relay-to-test, applying the determined path, and operating one or more of the relays within the path to determine a state of the relay-to-test (e.g., the relay-under-test) and/or other relays within the path. Embodiments of path mode testing are described in more detail below with regard to FIG. 7A. In some embodiments, path-mode testing may continue until each of the relays is solved or has at least been tested.

Method 300 may include executing S-T Cut mode testing, as depicted at block 310. S-T Cut mode testing may include determining the condition of a relay by identifying a relay-to-test, identifying partitions of the graph that exists at each vertex of the relay-to-test, identifying a set (e.g., cut-set) of relays/edges that when opened breaks the graph into two disjointed sub-graphs where one of the sub-graphs includes a source vertex (e.g., input at ab0) and the other of the sub-graph includes a destination vertex (e.g., output at ab1), opening the identified cut-set of relays, and cycling the relay-under-test to determine a condition of the relay-under-test. Embodiments of S-T Cut mode testing are described in more detail below with regard to FIG. 7B. In some embodiments, S-T Cut-mode testing may continue until each of the relays is solved or has at least been tested.

Method 300 may include checking for unsolved relays, as depicted at block 312. Checking for unsolved relays may include, reviewing whether or not all of the relays have been solved. For example, a relay table (e.g., table 120a-120c) may be reviewed to determine if any unsolved relays remain. If no unsolved relays remain (e.g., all relays have been solved), the workflow may progress to providing a solution 604, as depicted at block 616. Solution 604 may include providing the conditions of all of the solved and/or unsolved relays. In some embodiments, providing solution 604 includes providing a table (e.g., table 120a-120c) identifying each relay and their respective solution/condition. Where all relays have been solved, a condition of pass, stuck-open or stuck-closed may be provided for each relay.

Method 300 may include checking for progress, as depicted at block 318. In some embodiments, where it is determined that unsolved relays remain (at block 312), it may be determined whether any progress has been made in the preceding iteration of testing (e.g., execution of path-mode testing at 308 and/or S-T Cut testing mode at 310). Progress may include any additional information, including changes to conditions of relays, the addition/deletion of one or more knowledge units and/or modifications to one or more knowledge unit. If progress has been made, the workflow may return to another iteration of executing path-mode testing at 308 and/or S-T Cut testing mode at 310. Thus, any progress made may be applied to the subsequent iterations of path-mode testing at 308 and/or S-T Cut testing mode at 310 make additional progress. Where it is determined that no progress has been made as block 318, it may be determined that an additional iteration would not provide any additional information or progress. Thus, the workflow of method 300 may provide the current solution 314, as depicted at block 316.

Figure 7A:
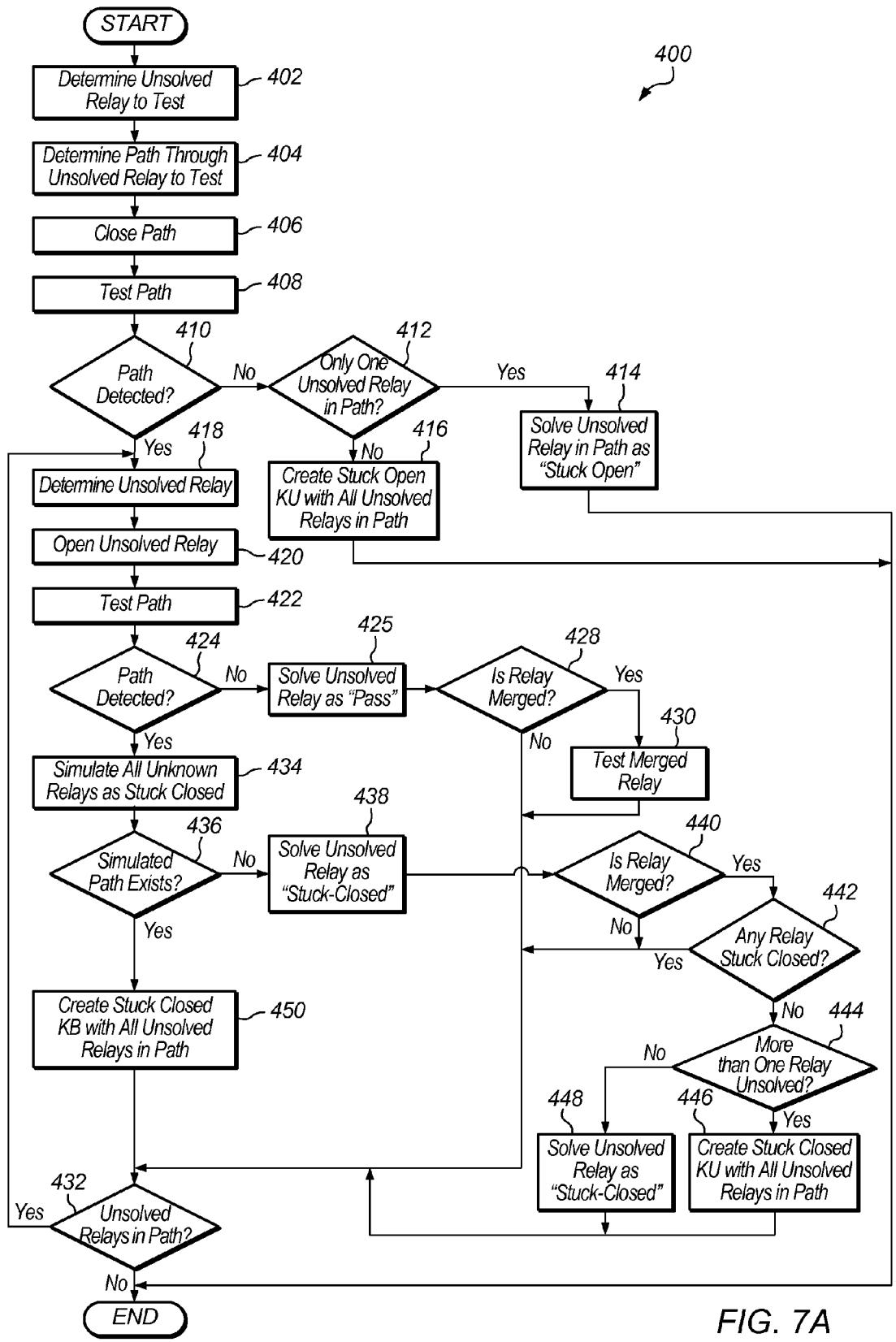
FIG. 7A is a flowchart that illustrates a method of executing path-mode testing in accordance with one or more embodiments of the present technique.

FIG. 7A is a flowchart that illustrates a method 400 of executing path-mode testing in accordance with one or more embodiments of the present technique. In some embodiments, method 400 may include an iteration of block 308, depicted and discussed with regard to FIG. 6. In some embodiments, method 400 includes determining an unsolved relay-to-test, as depicted at block 402. In some embodiments, a relay-to-test may be selected at random from one of the currently untested and/or unknown relays. In some embodiments, a relay-to-test may be selected by progressing down a relay table (e.g., 120a-120c of FIGS. 3A-3C) and selecting the next untested and/or unknown relay.

Method 400 may include determining a path through the unsolved relay-to-test, as depicted at block 404. In some embodiments, finding a path through the unsolved relay-to-test, as depicted at block 404 may include determining a simple path from a source to a destination that includes the relay-to-test as described above. For example, in FIG. 4B, where 102k is the relay-to-test, test path 134a may include test sub-path 130a from ab0 to r0 to c0 to r2, test sub-path 132a from c2 to r1 to ab1, and edge r2 to c2. In some embodiments, the determined path may be identified based on comparisons to other candidate paths, as discussed above. For example, the test path may include a test path with the lowest cost relative to other candidate test paths.

Method 400 may include closing the path, as depicted at block 406. In some embodiments, closing the path may include closing each of the relays contained in the path, as described above. For example, with regard to FIG. 4B during testing, path 134a may be closed by closing relays 104a, 102a, 102i, 102k, 104b and 102g.

Method 400 may include testing the path, as depicted at block 408. In some embodiments, testing the path may include checking for continuity across the path, as discussed above. For example, where ab0 includes a source vertex coupled to a first channel of a path detection circuit, and output at ab1 includes a destination vertex coupled to a second channel of the path detection circuit, the path detection circuit may be operated to determine whether a path is detected, as depicted at block 410. Where a path is not detected, it may be determined whether only one unsolved relay exists in the path, as depicted at block 412. If only one unsolved relay exists in the path, then the unsolved relay may be solved as stuck-open, as depicted at block 414. If more than one unsolved relay exists in the path, then method 400 may include creating a stuck-open knowledge unit ("KU") with all unsolved relays in the path, as depicted at block 416. For example, a knowledge unit identifying the set of unsolved relays and their condition of stuck-open may be generated, as discussed above with regard to FIG. 5. The workflow may end the iteration of method 400 upon solving the only unsolved relay in the path or creating the knowledge unit. In some embodiments, upon ending method 400, the workflow may return to block 310 of method 300 depicted and discussed with regard to FIG. 6.

Method 400 may include determining an unsolved relay, as depicted at block 418. In some embodiments, determining an unsolved relay may include identifying one of the relays in the path through the unsolved relay (determined at block 404). For example, upon detecting a path at block 410, the relay-under-test may be determined to be the unsolved relay at block 418. As discussed in more detail below, in subsequent iterations, one of the other unsolved relays in the path may be determined to be the unsolved relay.

Method 400 may include opening the unsolved relay, as depicted at block 420. In some embodiments, opening the unsolved relay may include commanding all of the relays in the path, except the unsolved relay, to close and commanding the unsolved relay to open. Method 400 may include testing the path, as depicted at block 422. In some embodiments, testing the path may include checking for continuity across the path, as discussed above. For example, the path detection circuit may be operated to determine whether a path is detected across the unsolved relay and the test path, as depicted at block 424. Where a path is not detected, method 400 may include solving the unsolved relay as having a pass condition, as depicted at block 425.

Method 400 may also include determining whether or not the unsolved relay, now solved as passed, is a merged relay, as depicted at block 428. In some embodiments, a merged relay is determined by referencing a graph (e.g., graph 110a-110c) or corresponding table (e.g., table 120a-120c). If the relay is determined to be merged, method 400 may include testing the merged relay, as depicted at block 430. Testing the merged relay may include the workflow described in more detail below with regard to FIG. 8A. If the relay is determined to not be merged or the testing of the merged relay at block 430 has completed, the workflow of method 400 may include advancing to determining whether or not an untested (e.g., has not been individually opened at block 420) and unsolved relay exists in the path, as depicted at block 432. If additional untested and unsolved relays exist in the path, the workflow of method 400 may return to block 418 to execute another iteration of testing with regard to one of the untested/unsolved relays that remain. If no additional untested and unsolved relays exist in the path, the workflow of method 400 may end the current iteration of method 400. In some embodiments, upon ending method 400, the workflow may return to block 310 of method 300 depicted and discussed with regard to FIG. 6.

Method 400 may include simulating all unknown relays except relay-under-test as stuck-closed, as depicted at block 434. In some embodiments, where a path is detected at block 424, simulating all unknown relays as stuck-closed includes simulating all unsolved relays (e.g., relays labeled as having a condition of untested or unknown) of matrix 100 (not just relays within the test path) as stuck-closed. Method 400 may, then, determine that with all of the unknown relays simulated in the stuck-closed position and the unsolved relay in the open position, could a simulated path exists that provides continuity between the source and the destination, as depicted at block 436. For example, to determine whether a path exists across all relays solved as stuck-closed and all unsolved relays other than the current unsolved relay-under-test that could provide continuity between the source and the destination of the path. If it is determined that such a simulated path does not exist, method 400 may include determining that the unsolved relay currently under test is stuck-closed, as depicted at block 436. In some embodiments, method 400 may then include determining whether the unsolved relay is merged, as depicted at block 440. If it is determined that the relay is not merged, the workflow of method 400 may include advancing to determining whether or not an untested and unsolved relay exists in the path, as depicted at block 432. If the relay is determined to be merged at block 440, a determination may be made as to whether any of the individual relays of the merged relay are solved as stuck-closed, as depicted at block 442. If it is determined that any of the individual relays of the merged relay are solved as stuck-closed, the workflow of method 400 may include advancing to determining whether or not an untested and unsolved relay exists in the path, as depicted at block 432. If it is determined that none of the individual relays of the merged relay are solved as stuck-closed, it may be determined whether there is more than one unsolved relay among the individual relays of the merged relay, as depicted at block 444. If it is determined that there is more than one unsolved relay among the individual relays of the merged relay, then a stuck-open knowledge unit including all of the unsolved individual relays of the merged relay may be created, as depicted at block 446, and the workflow of method 400 may include advancing to determining whether or not an untested and unsolved relay exists in the path, as depicted at block 432. If it is determined that there not more than one unsolved relay among the individual relays of the merged relay, then the unsolved relay of the individual relays is solved as stuck-closed, as depicted at block 448, and the workflow of method 400 may include advancing to determining whether or not an untested and unsolved relay exists in the path, as depicted at block 432. If it is determined that such a simulated path does exist, method 400 may include creating a stuck-closed knowledge unit with all unsolved relays in the path, as depicted at block 450. For example, a knowledge unit identifying the set of unsolved relays and their condition of stuck-closed may be generated, ad discussed above with regard to FIG. 5. The workflow of method 400 may include advancing to determining whether or not an untested and unsolved relay exists in the path, as depicted at block 432.

Figure 7B:
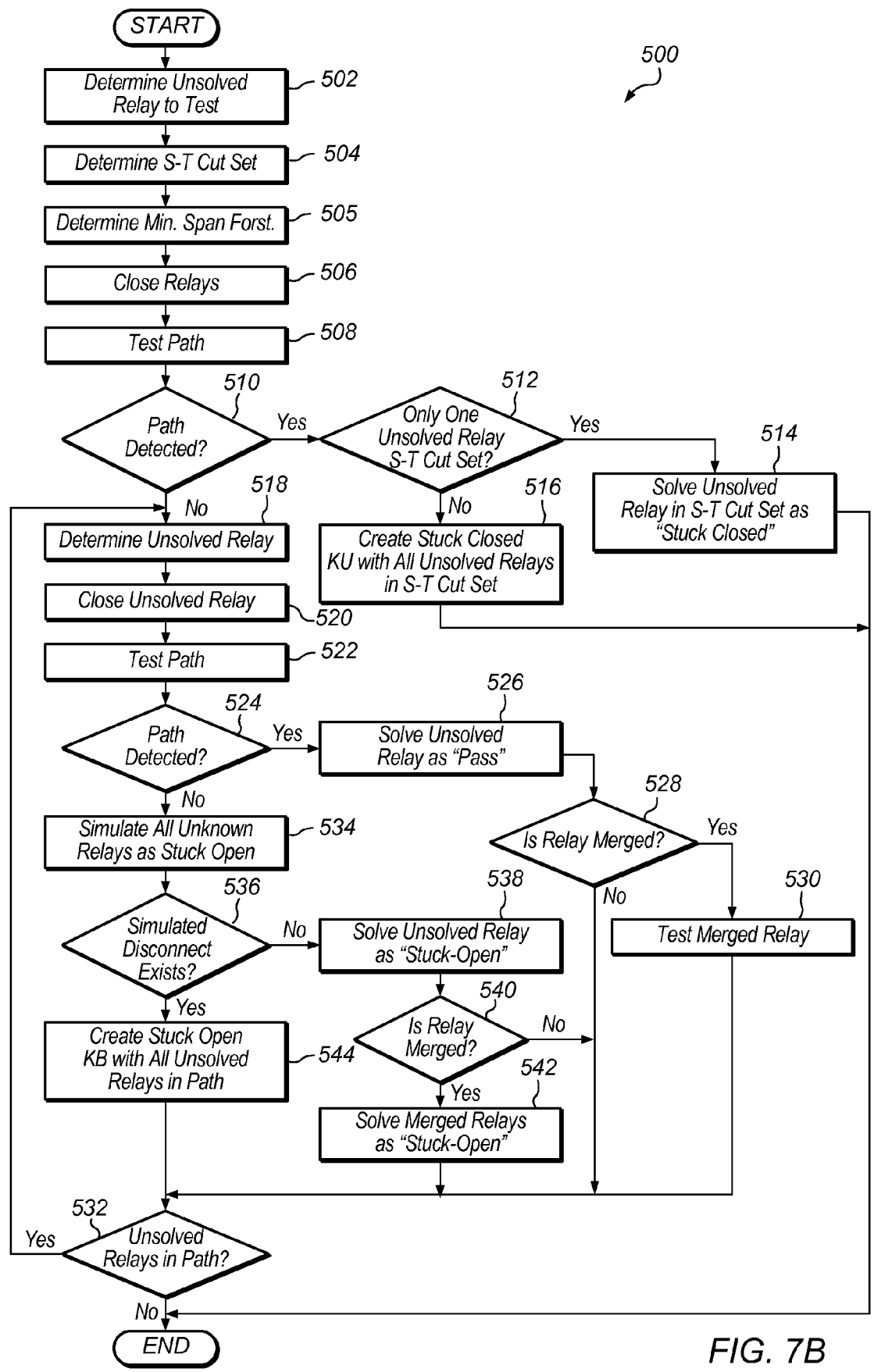
FIG. 7B is a flowchart that illustrates a method of executing S-T Cut mode testing in accordance with one or more embodiments of the present technique.

FIG. 7B is a flowchart that illustrates a method 500 of executing S-T Cut mode testing in accordance with one or more embodiments of the present technique. In some embodiments, method 500 may include an iteration of block 310, depicted and discussed with regard to FIG. 6. In some embodiments, method 500 includes determining an unsolved relay-to-test, as depicted at block 502. In some embodiments, a relay-to-test may be selected at random from one of the currently untested and/or unknown relays. In some embodiments, a relay-to-test may be selected by progressing down a relay table (e.g., 120a-120c of FIGS. 3A-3C) and selecting the next untested and/or unknown relay.

Method 500 may include determining an S-T Cut set, as depicted at block 504. In some embodiments, determining an S-T Cut set test may include: finding a path that goes through the unsolved relay-to-test, where the source and destination vertices include two channels connected to a path detection circuit (e.g., input at ab0 and output ab1 of FIGS. 1A and 1B), determining a set of relays that divide the full graph into two sets separated by vertices of the set of relays. The S-T Cut set may include the set of relays that divide the full graph into two sets separated by vertices of the set of relays. In some embodiments, the S-T Cut set includes the relay unsolved relay-to-test.

Method 500 may include determining a minimum spanning forest, as depicted at block 505. Determining a set of relays to be closed during the S-T Cut test may be determined based on a minimum spanning forest for disjoined graphs, using Kruskal's algorithm. To determine the minimum spanning forest, a copy of the current graph representation of the switch may be stored in memory. Edges corresponding to the S-T Cut set determined may be removed from the graph, resulting in two disjointed graphs. Then Kruskal's algorithm may be applied to the graphs. The relays corresponding to the edges in the calculated minimum spanning tree are closed, the rest of the relays are left open.

Method 500 may include closing relays, as depicted at block 506. In some embodiments, closing relays may include closing all of the relays corresponding to the minimum spanning forest determined at block 505. In some embodiments, all other relays are other than the S-T cut set are closed. In some embodiments, only the set of relays associated with the minimum spanning forest are closed.

Method 500 may include testing the path, as depicted at block 508. In some embodiments, testing the path may include checking for continuity across the path, as discussed above. For example, where ab0 includes a source vertex coupled to a first channel of a path detection circuit, and output at ab1 includes a destination vertex coupled to a second channel of the path detection circuit, the path detection circuit may be operated to determine whether a path is detected, as depicted at block 510. Where a path is detected, it may be determined whether only one unsolved relay exists in the S-T Cut set, as depicted at block 512. If only one unsolved relay exists in the S-T Cut set, then the unsolved relay may be solved as stuck-closed, as depicted at block 514. If more than one unsolved relay exists in the S-T Cut set, then method 500 may include creating a stuck-closed knowledge unit ("KU") with all unsolved relays in the S-T Cut set, as depicted at block 516. For example, a knowledge unit identifying the set of unsolved relays and their condition of stuck-closed may be generated, as discussed above with regard to FIG. 5. The workflow may end the iteration of method 500 upon solving the only unsolved relay in the S-T cut set or creating the knowledge unit. In some embodiments, upon ending method 500, the workflow may return to block 312 of method 300 depicted and discussed with regard to FIG. 6.

Method 500 may include determining an unsolved relay, as depicted at block 518. In some embodiments, determining an unsolved relay may include identifying one of the relays in the S-T Cut set (determined at block 504). For example, upon not detecting a path at block 510, the relay-under-test may be determined to be the unsolved relay at block 518. As discussed in more detail below, in subsequent iterations, one of the other unsolved relays in the S-T Cut set may be determined to be the unsolved relay.

Method 500 may include closing the unsolved relay, as depicted at block 520. In some embodiments, closing the unsolved relay may include commanding all of the relays in the S-T Cut set, except the unsolved relay, to open and commanding the unsolved relay to close. Method 500 may include testing the path, as depicted at block 522. In some embodiments, testing the path may include checking for continuity across the path, as discussed above. For example, the path detection circuit may be operated to determine whether a path is detected across the unsolved relay, as depicted at block 524. Where a path is detected, method 500 may include solving the unsolved relay as having a pass condition, as depicted at block 526.

Method 500 may also include determining whether or not the unsolved relay, now solved as passed is a merged relay, as depicted at block 528. In some embodiments, a merged relay is determined by referencing a graph (e.g., graph 110a-110c) or corresponding table (e.g., table 120a-120c). If the relay is determined to be merged, method 500 may include testing the merged relay, as depicted at block 530. Testing the merged relay may include the workflow described in more detail below with regard to FIG. 8B. If the relay is determined to not be merged or the testing of the merged relay at block 530 has completed, the workflow of method 500 may include advancing to determining whether or not an untested (e.g., has not been individually opened at block 520) and unsolved relay exists in the path, as depicted at block 532. If additional untested and unsolved relays exist in the path, the workflow of method 500 may return to block 518 to execute another iteration of testing with regard to one of the untested/unsolved relays that remain. If no additional untested and unsolved relays exist in the path, the workflow of method 500 may end the current iteration of method 500. In some embodiments, upon ending method 500, the workflow may return to block 312 of method 300 depicted and discussed with regard to FIG. 6.

Method 500 may include simulating all unknown relays as stuck-open except for the relay-under-test, as depicted at block 534. In some embodiments, where a path is not detected at block 524, simulating all unknown relays as stuck-open includes simulating all unsolved relays (e.g., relays labeled as having a condition of untested or unknown) of matrix 100 (not just relays within the S-T Cut set) as stuck-open. Method 500 may, then, determine that with all of the unknown relays simulated in the stuck-open position and the unsolved relay in the closed position, could a simulated disconnect exists that that eliminates continuity between the disjointed sub-graphs where one of the sub-graphs includes the source vertex (e.g., input at ab0) and the other of the sub-graph includes the destination vertex (e.g., output at ab1), as depicted at block 536. For example, to determine whether a set of unknown relays be stuck-open such that they provide for the discontinuity between the source and the destination. If it is determined that such a simulated disconnect does not exists, method 500 may include determining that the unsolved relay currently under test is stuck-open, as depicted at block 538. In some embodiments, method 500 may then include determining whether the unsolved relay is merged, as depicted at block 540. If it is determined that the relay is not merged, the workflow of method 500 may include advancing to determining whether or not an untested and unsolved relay exists in the path, as depicted at block 432. If the relay is determined to be merged at block 540, then the relays of the merged relays are solved as stuck-opened, as depicted at block 542, and the workflow of method 500 may include advancing to determining whether or not an untested and unsolved relay exists in the path, as depicted at block 532. If it is determined that such a simulated disconnect does exists, method 500 may include creating a stuck-open knowledge unit with all unsolved relays in the S-T Cut set, as depicted at block 540. For example, a knowledge unit identifying the set of unsolved relays in the S-T Cut set and their condition of stuck-open may be generated, as discussed above with regard to FIG. 5. The workflow of method 500 may include advancing to determining whether or not an untested and unsolved relay exists in the path, as depicted at block 532.

Figure 8A:
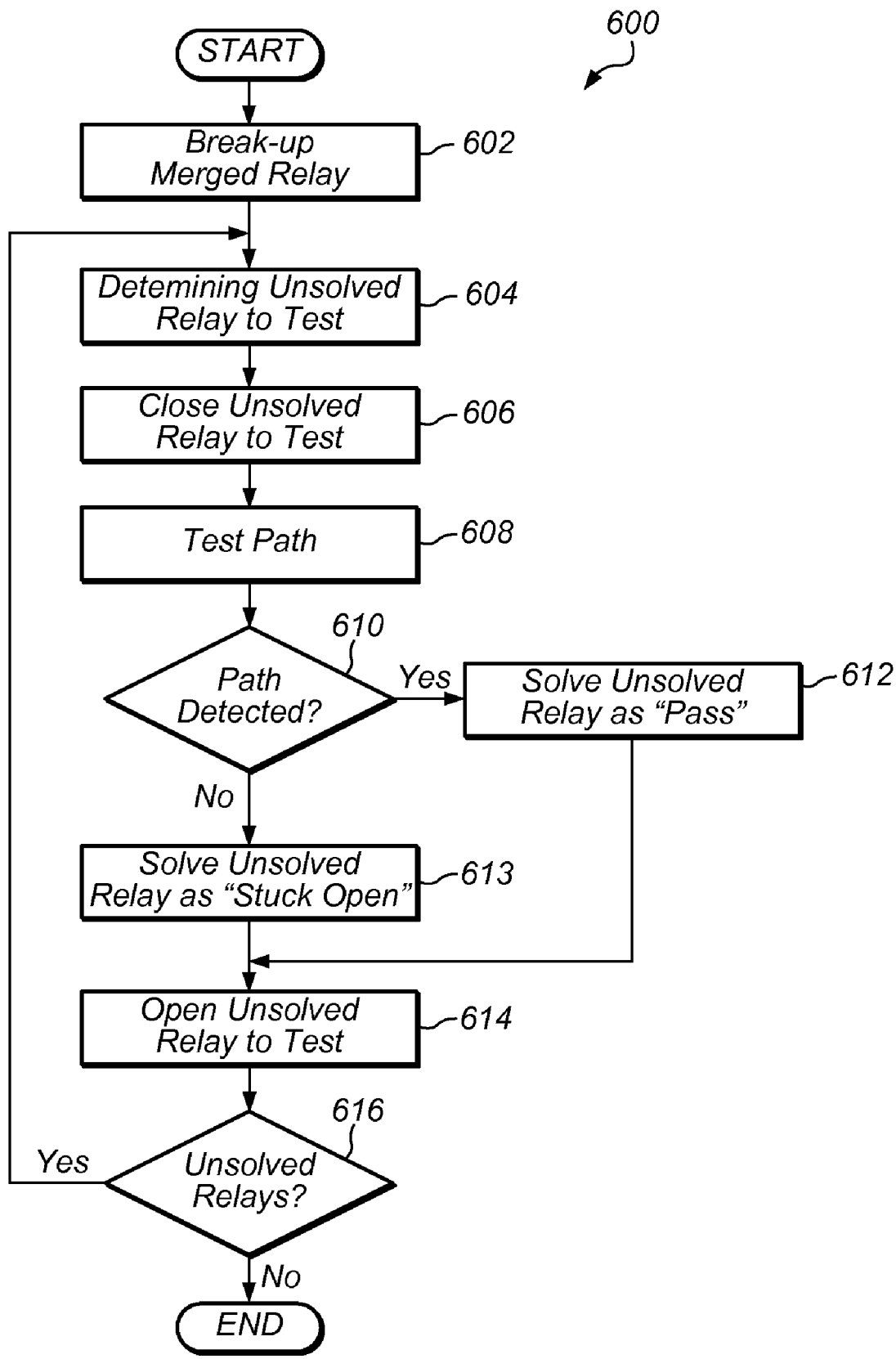
FIGS. 8A and 8B are flowcharts that illustrate methods of testing merged relays in accordance with one or more embodiments of the present technique.

FIG. 8A is a flowchart that illustrates a method 600 of testing merged relays in accordance with one or more embodiments of the present technique. In some embodiments, method 600 may include an iteration of block 430, depicted and discussed with regard to FIG. 7A. Method 600 may include breaking-up the merged relay, as depicted at block 602. In some embodiments, breaking-up the merged relay 602 includes identifying the individual relays that have been previously identified as part of the merged relay. For example, merged relays 102o and 102p discussed above with respect to FIG. 2C, may be identified separately. Method 600 may include determining the next unsolved relay-to-test, as depicted at block 604. In some embodiments, determining the next unsolved relay-to-test may include selecting one of the merged relays that have been identified individually, and that have not been resolved. Method 600 may include closing the unsolved relay-to-test, as depicted at block 606. In some embodiments, closing the relay-to-test may restore the path not detected at block 424. Method 600 may include testing the path, as depicted at block 608. In some embodiments, testing the path may include checking for continuity across the path, as discussed above. For example, where ab0 includes a source vertex coupled to a first channel of a path detection circuit, and output at ab1 includes a destination vertex coupled to a second channel of the path detection circuit, the path detection circuit may be operated to determine whether a path is detected across the unsolved relay, as depicted at block 610. Where a path is detected, the unsolved relay of the merged relay may be solved as having a pass condition, as depicted at block 612. Where a path is not detected, method 600 may include solving the unsolved relay as stuck-open, as depicted at block 613. Method 600 may include opening the unsolved relay-to-test, as depicted at block 614. Opening the unsolved relay-to-test may occur subsequent to determining that a path was not detected or solving the relay as having a pass condition. Method 600 may include determining whether any unsolved relays remain, as depicted at block 614. In some embodiments, determining whether any unsolved relays remains includes determining whether any of the individual relays of the merged relay are unsolved. Upon determining that unsolved relays remain in the merged relay, workflow of method 600 may include returning to identifying another unsolved relay-to-test, at block 604. Upon determining that no unsolved relays remain in the merged relay, workflow of method 600 may end. In some embodiments, upon ending, the workflow of method 600 may return to block 432 of FIG. 7A.

Figure 8B:
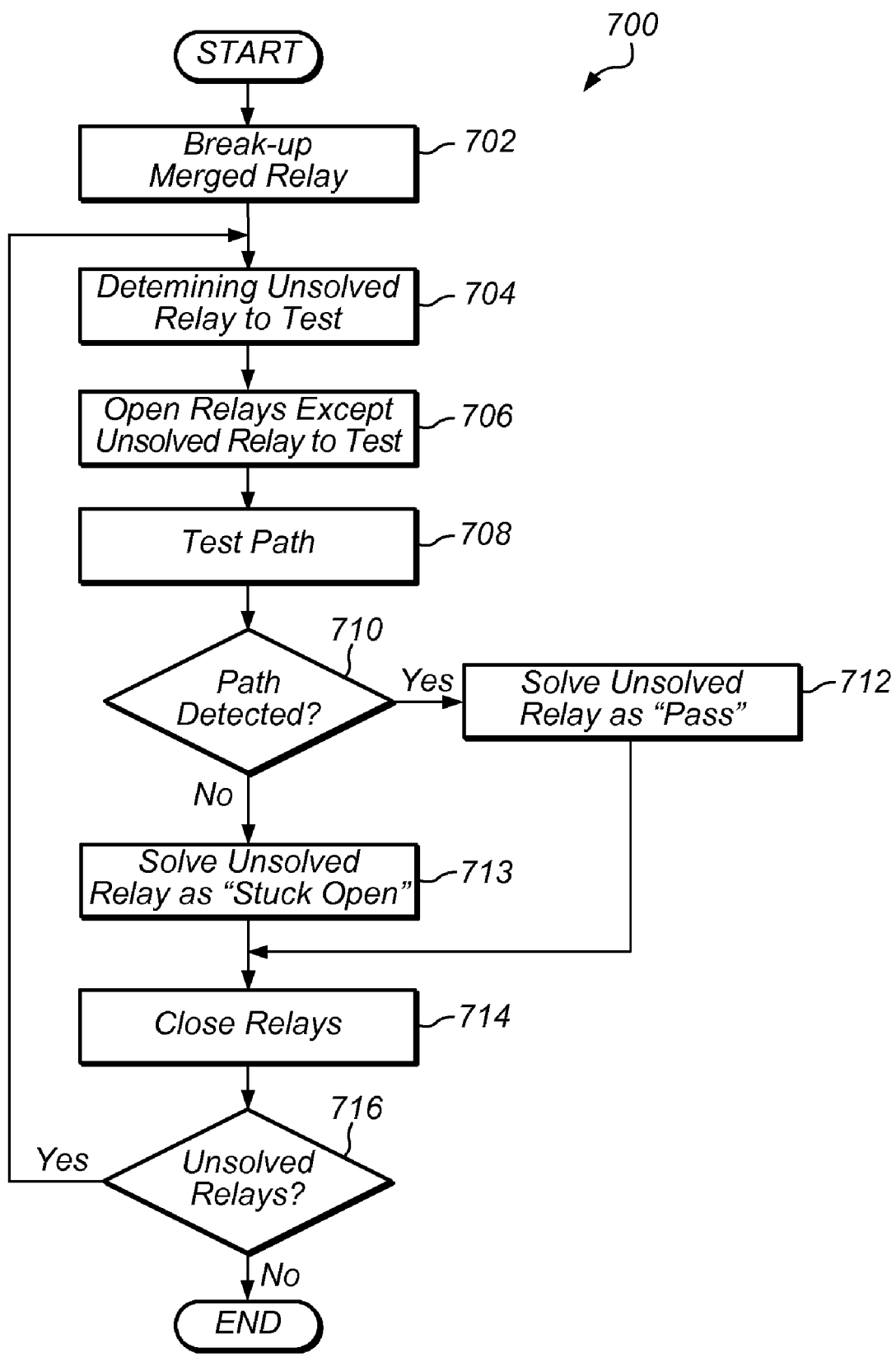

FIG. 8B is a flowchart that illustrates a method 700 of testing merged relays in accordance with one or more embodiments of the present technique. In some embodiments, method 700 may include an iteration of block 530, depicted and discussed with regard to FIG. 7B. Method 700 may include braking-up the merged relay, as depicted at block 702. In some embodiments, breaking-up the merged relay includes identifying the individual relays that have been previously identified as part of the merged relay. For example, merged relays 102o and 102p discussed above with respect to FIG. 2C, may be identified separately. Method 700 may include determining the next unsolved relay-to-test, as depicted at block 704. In some embodiments, determining the next unsolved relay-to-test may include selecting one of the merged relays that have been identified individually, and that have not been resolved. Method 700 may include opening all individual relays that compose the merged relay except for relay-to-test, as depicted at block 706. In some embodiments, opening the relay-to-test may break the path detected at block 524. Method 700 may include testing the path, as depicted at block 708. In some embodiments, testing the path may include checking for continuity across the path, as discussed above. For example, where ab0 includes a source vertex coupled to a first channel of a path detection circuit, and output at ab1 includes a destination vertex coupled to a second channel of the path detection circuit, the path detection circuit may be operated to determine whether a path is detected across the unsolved relay, as depicted at block 710. Where a path is detected, the unsolved relay of the merged relay may be solved as having a pass condition, as depicted at block 712. Where a path is not detected, method 600 may include solving the unsolved relay as stuck-open, as depicted at block 613. Method 700 may include closing the relays, as depicted at block 714. Closing the relays may include closing the relays opened at block 706. Method 700 may include determining whether any unsolved relays remain, as depicted at block 714. In some embodiments, determining whether any unsolved relays remains includes determining whether any of the individual relays of the merged relay are unsolved. Upon determining that unsolved relays remain in the merged relay, workflow of method 700 may include returning to identifying another unsolved relay-to-test, at block 704. Upon determining that no unsolved relays remain in the merged relay, workflow of method 700 may end. In some embodiments, upon ending, the workflow of method 700 may return to block 532 of FIG. 7B.

Figure 9:
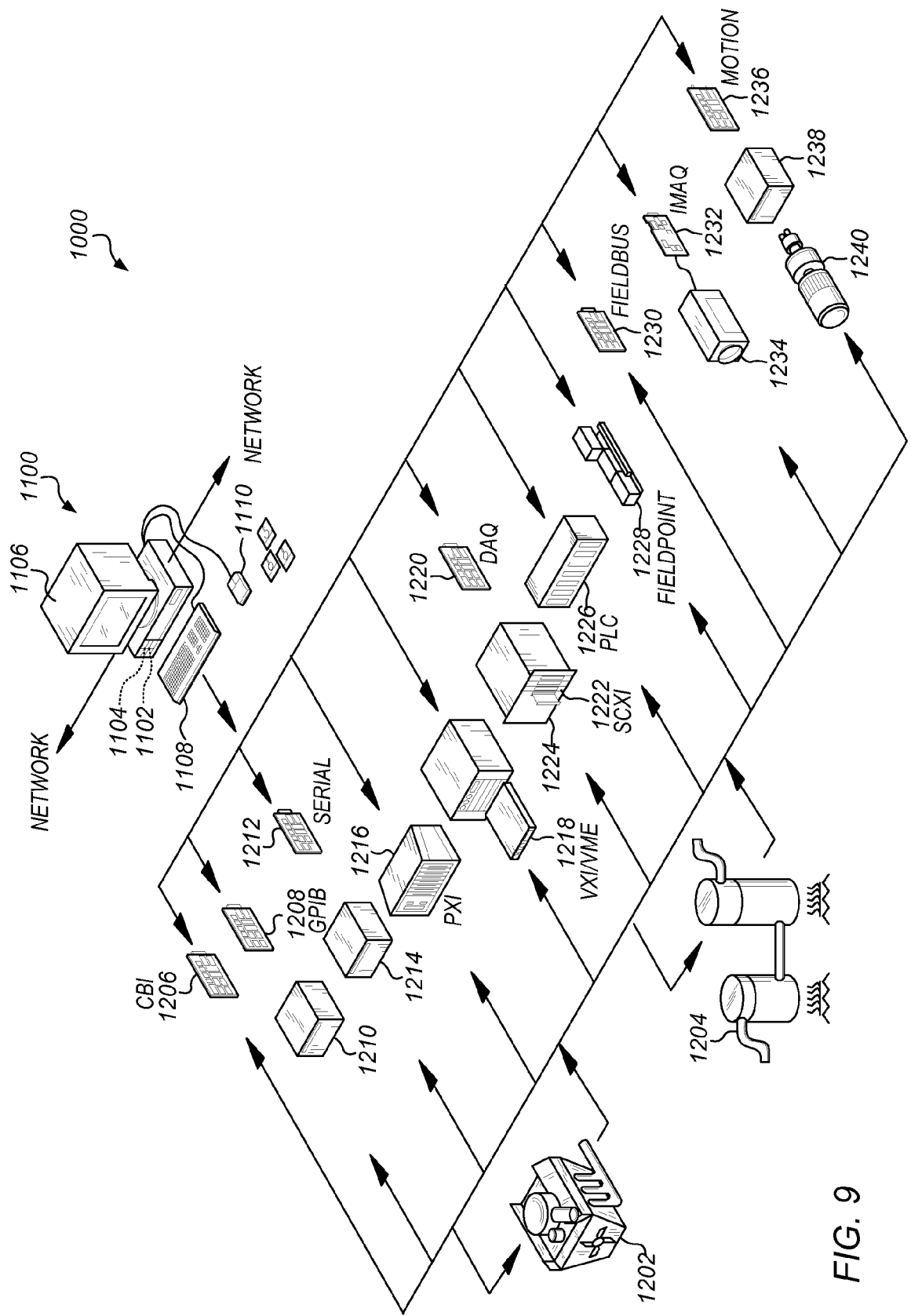
FIG. 9 is diagram of an exemplary computer system in accordance with one or more embodiments of the present technique.

In some embodiments, the above techniques may be implemented via an application executed on a computer that facilitates communication with corresponding switch/relay hardware. FIG. 9 illustrates an exemplary measurement/control system ("computer system") 1000 that may implement one or more embodiments of the present technique. Computer system 1000 may include various combinations of hardware and software that include devices that can be used to implement various computer based processes.

In the illustrated embodiment, computer system 1000 includes a host computer system 1100. Host computer system 1100 may be operable to execute computer programs/routines that provide various computer related functions, such as those for implementing routines for testing a relay/switch matrix as described herein. For example, instructions for implementing the techniques described herein may be stored an executed by one or more of the computer systems/device of computer system 1000, such as host computer system 1100. Moreover, relay/switch matrix 100 may be implemented in a switch/relay module provided within system 1000. Host computer system 1100 may include various components such as central processing unit (CPU) 1102 and a memory medium 1104. Memory medium 1104 may include a tangible non-transitory computer readable storage medium, such as random access memory (RAM), flash memory, hard-drives, and/or CD-ROMs, or the like. Memory medium 1104 may have program instructions stored thereon that are executable (e.g., by CPU 1102) to implement one or more computer implemented methods, such as those for implementing routines for testing a relay/switch matrix as described herein. In the illustrated embodiment, host computer system 1100 includes a display device (e.g., a monitor) 1106, an alphanumeric input device (e.g., a keyboard) 1108, and a directional input device (e.g., a mouse) 1110. In some embodiments, host computer system 1100 may include modular and/or plug-in boards/cards (e.g., with either commercially available or proprietary hardware) that may be added via a number of expansion slots internal or external to the computer body. For example, host computer system 1100 may include PCI/PCI Express slots and PCI/PCI Express cards disposed therein. As described in more detail below, host computer system 1100 may be connected to one or more devices, such as an expansion chassis for connecting to a various number and combination of devices. In certain embodiments, host computer system 1100 and/or other portions of computer system 1000 may be connected to one or more other devices via a network, such as an internal network (e.g., a local area network (LAN)) and/or an external network (e.g., the internet). In certain embodiments, host computer system 1100 may be used for various input/output (I/O) functions and processing tasks. For example, host computer system 1100 may be used for data acquisition (DAQ) (e.g., when a DAQ digitizing board is installed in computer 1100 or a device coupled thereto, such as a chassis, and associated software is run).

Host computer system 1100 may be configured to connect/communicate with other instruments/devices of computer system 1000. In some embodiments, host computer system 1100 may operate with the one or more devices of computer system 1000 to generate and provide data, to acquire data, to analyze data. For example, computer system may communicatively couple to and control one or more devices 1202, processes 1204, or the like. In some embodiments, devices 1201 may include universal serial bus (USB) devices. Host computer system 1100 may operate with the one or more devices in communication with device 1202 or process 1204 to perform an automation function, such as MMI (Man Machine Interface), SCADA (Supervisory Control and Data Acquisition), portable or distributed data acquisition, process control, advanced analysis, or other data acquisition and control functions. For example, computer system 100 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 100 may include a programmable hardware element, using an FPGA or a processor and memory, and/or one or more portions of user code.

Computer system 1000 may include a variety of devices. For example, computer system 1000 may include modular instrumentation devices, such test and measurement devices manufactured by National Instruments Corporation, headquartered in Austin, Tex. In some embodiments, computer system 1000 may include computer based instrumentation (CBI) 1206, such as a digital multi-meter (DMM), an oscilloscope (SCOPE), a radio-frequency (RF) device (e.g., up-converter or down-converter), an arbitrary waveform generator (ARB), or the like. Computer system 1000 may include general purpose interface bus (GPIB) device 1208, such as a modular GPIB card used to communicate with a GPIB device 1210 (e.g., an oscilloscope) via a GPIB communication protocol. Computer system 1000 may include a serial device 1212, such as a modular serial card used to communicate with a serial device 1214 (e.g., an oscilloscope) via a serial communication protocol. Computer system 1000 may include a (PXI) device 1216, such as a PXI chassis having PXI form factor modular devices (e.g., modules) installed therein. Computer system 1000 may include a (VXI/VME) device 1218, such as a VXI/VME chassis having VXI/VME form factor modular devices (e.g., VXI/VME controllers/modules) installed therein. Computer system 1000 may include data acquisition (DAQ) device 1220, such as modular instrumentation including data input/output (I/O) interfaces for receiving, transmitting, conditioning, and/or processing signals (e.g., digital and analog signals). Computer system 1000 may include signal conditioning (SCXI) devices 1222 that can be used to condition and/or route signals, such as I/O signals as those transmitted/received at DAQ device 1220. SCXI device 1222 may include a chassis 1224 having devices 1222 installed therein (e.g., a relay/switch module having a relay/switch matrix). Computer system 1000 may include a programmable logic controller (PLC) 1226, such as a PLC used for the automation of electromechanical process. Computer system 1000 may include a distributed I/O module, such as a fieldpoint module 1228. Computer system 1000 may include a distributed control module, such as a fieldbus module 1230. Computer system 1000 may include an image acquisition (IMAQ) system, such as a modular IMAQ module 1232 and an associated IMAQ device (e.g., camera) 1234. Computer system 1000 may include a motion control system, such as a modular motion controller device 1236, a motor drive 1238, and a motor 1240. Computer system 100 may include any variety of other devices. Although some of the devices are illustrated in association with a chassis (e.g., modules) and some are illustrated independent from a chassis (e.g., card or standalone devices), embodiments may include all or some of the described device being provided in a module form factor to be housed in a chassis and/or a card form factor be installed in computer 1100. For example, PXI device 1216 may include a PXI chassis housing any combination of modular CBI devices, GPIB devices, serial devices, SCXI devices, DAQ devices, IMAQ devices, motion devices, or the like. For example a PXI form factor switch/relay module having a relay/switch matrix may be provided. In some embodiments, a switch may be provided on a carrier that is disposed in a PXI module housed in a PXI chassis. The devices may also be provided in a PCI form factor and installed in PCI slots of computer 1100. In some embodiments, computer system 1100 may include a test and measurement device, such as a digital millimeter (DMM). In some embodiments, the DMM may employ the techniques discussed herein to test relays of a switch coupled thereto. For example, the DMM may be used to measure the connectivity or resistance between two channels of the switch when appropriate as described above with regard to the test routine.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include", and derivations thereof, mean "including, but not limited to". As used in this specification, the singular forms "a", "an" and "the" include plural referents unless the content clearly indicates otherwise. Thus, for example, reference to "a device" includes a combination of two or more devices.

I claim:

1. A method of testing a relay set, comprising:
utilizing a computer to perform:
mapping an undirected graph indicative of a topology of the relay set, wherein the undirected graph is stored in computer memory, wherein the undirected graph comprises vertices indicative of channels of the relay set and edges indicative of relays of the relay set, wherein edges extend between corresponding vertices;
storing values corresponding to the edges of the undirected graph, wherein the assigned value for each edge is based on a characteristic of a relay of the relay set that corresponds to the respective edge;

identifying a plurality of candidate test paths for a relay-to-test, wherein each of the plurality of candidate test paths connect a first input/output (I/O) channel and a second I/O channel, and comprises the relay-to-test;
determining a total value for each of the candidate test paths, wherein determining a total value for a given one of the candidate test paths comprises totaling the values for the edges of the given one of the candidate test paths;
comparing the total values for each of the candidate test paths to one another; and
determining a test path for the relay-to-test based on the comparison of the total values for each of the candidate test paths to one another.

2. The method of claim 1, wherein identifying a plurality of candidate test paths for the relay-to-test comprises:
identifying a first candidate sub path that connects the first I/O channel to a first terminal of the relay-to-test; and
identifying a second candidate sub path that connects the second I/O channel to a second terminal of the relay-to-test.

3. The method of claim 1, wherein storing values corresponding to edges of the undirected graph comprises:
assigning a low/high value to edges that correspond to relays having an untested condition;
assigning an intermediate value to edges that correspond to relays having an unknown condition;
assigning a high/low value to edges that correspond to relays having a passed condition; and
wherein determining a test path for the relay-to-test comprises selecting one of the plurality of candidate test paths having the lowest/highest total value.

4. The method of claim 1, further comprising:
implementing the test path using the relay matrix;
checking for continuity across the first and second I/O channels; and
determining a condition of the relay-to-test based on the checking for continuity.

5. The method of claim 1, further comprising dynamically updating the undirected graph upon determining a condition of a relay of the relay set, wherein dynamically updating the undirected graph comprises modifying the undirected graph to reflect the topology of the relay set including the determined condition of the relay.

6. The method of claim 5, further comprising determining that a relay of the relay set is stuck-open, and wherein dynamically updating the undirected graph comprises removing from the undirected graph the edge corresponding to the relay determined to be stuck-open.

7. The method of claim 5, further comprising determining that a relay of the relay set is stuck-closed, and wherein dynamically updating the undirected graph comprises merging within the undirected graph the vertices corresponding to the relay determined to be stuck-closed.

8. The method of claim 1, further comprising
identifying that at least one of a set of relays has a particular failure condition;
storing a knowledge unit identifiers for each of the set of relays in association with the particular condition; and
accessing the knowledge unit, upon subsequently determining a condition of a relay of the relay set, to determine a condition of one or more relays of the set of relays based on the subsequently determined condition of the relay of the relay set.

9. The method of claim 1, further comprising:
determining an S-T cut set of relays, wherein opening of the S-T cut set of relays partitions the relay set into a first partition connected to the first I/O channel and a second partition connected to the second I/O channel;
determining a minimum spanning forest relay set, wherein the minimum spanning forest relay set comprises a minimum number of relays to close;
opening relays of the S-T cut set; and
closing relays of the minimum forest relay set.

10. A non-transitory computer readable storage medium comprising program instructions stored thereon, wherein the program instructions are executable to cause a computer system to perform a method of testing a relay set, comprising:
mapping a relay set to an undirected graph indicative of a topology of the relay set, wherein the undirected graph comprises vertices indicative of channels of the relay set and edges indicative of relays of the relay set, wherein edges extend between corresponding vertices;
assigning values to edges of the undirected graph, wherein the assigned value for each edge is based on a characteristic of a relay of the relay set that corresponds to the respective edge;
identifying a plurality of candidate test paths for a relay-to-test, wherein each of the plurality of candidate test paths connect a first input/output (I/O) channel and a second I/O channel, and comprises the relay-to-test;
determining a total value for each of the candidate test paths, wherein determining a total value for a given one of the candidate test paths comprises totaling the values for the edges of the given one of the candidate test paths;
comparing the total values for each of the candidate test paths to one another; and
determining a test path for the relay-to-test based on the comparison of the total values for each of the candidate test paths to one another.

11. The storage medium of claim 10, wherein identifying a plurality of candidate test paths for the relay-to-test, comprises identifying a first candidate sub path that connects the first I/O channel to a first terminal of the relay-to-test, and identifying a second candidate sub path that connects the second I/O channel to a second terminal of the relay-to-test.

12. The storage medium of claim 10, wherein assigning values to edges of the undirected graph comprises:
assigning a low/high value to edges that correspond to relays having an untested condition;
assigning an intermediate value to edges that correspond to relays having an unknown condition;
assigning a high/low value to edges that correspond to relays having a passed condition; and
wherein determining a test path for the relay-to-test comprises selecting one of the plurality of candidate test paths having the lowest/highest total value.

13. The storage medium of claim 10, wherein the method further comprises:
implementing the test path using the relay set;
checking for continuity across the first and second I/O channels; and
determining a condition of the relay-to-test based on the checking for continuity.

14. The storage medium of claim 10, wherein the method further comprises dynamically updating the undirected graph upon determining a condition of a relay of the relay set, wherein dynamically updating the undirected graph comprises modifying the undirected graph to reflect the topology of the relay set including the determined condition of the relay.

15. The storage medium of claim 14, wherein the method further comprises determining that a relay of the relay set is stuck-open, and wherein dynamically updating the undirected graph comprises removing from the undirected graph the edge corresponding to the relay determined to be stuck-open.

16. The storage medium of claim 14, wherein the method further comprises determining that a relay of the relay set is stuck-closed, and wherein dynamically updating the undirected graph comprises merging within the undirected graph the vertices corresponding to the relay determined to be stuck-closed.

17. The storage medium of claim 10, wherein the method further comprises:
    identifying that at least one of a set of relays has a particular failure condition;
    storing a knowledge unit identifiers for each of the set of relays in association with the particular condition; and
    accessing the knowledge unit, upon subsequently determining a condition of a relay of the relay set, to determine a condition of one or more relays of the set of relays based on the subsequently determined condition of the relay of the relay set.

18. The storage medium of claim 10, wherein the method further comprises:
    determining an S-T cut set of relays, wherein opening of the S-T cut set of relays partitions the relay set into a first partition connected to the first I/O channel and a second partition connected to the second I/O channel;
    determining a minimum spanning forest relay set, wherein the minimum spanning forest relay set comprises a minimum number of relays to close;
    opening relays of the S-T cut set; and
    closing relays of the minimum forest relay set.

19. A system, comprising:
    a computer system configured to:
        map a relay set to an undirected graph indicative of a topology of the relay set, wherein the undirected graph comprises vertices indicative of channels of the relay set and edges indicative of relays of the relay set, wherein edges extend between corresponding vertices;
        assign values to edges of the undirected graph, wherein the assigned value for each edge is based on a characteristic of a relay of the relay set that corresponds to the respective edge;
        identify a plurality of candidate test paths for a relay-to-test, wherein each of the plurality of candidate test paths connect a first input/output (I/O) channel and a second I/O channel, and comprises the relay-to-test;
        determine a total value for each of the candidate test paths, wherein determining a total value for a given one of the candidate test paths comprises totaling the values for the edges of the given one of the candidate test paths;
        compare the total values for each of the candidate test paths to one another; and
        determine a test path for the relay-to-test based on the comparison of the total values for each of the candidate test paths to one another.

20. The system of claim 19, further comprising a switch module comprising the relay set.

* * * * *